(12) United States Patent
Halpin et al.

(10) Patent No.: US 9,340,874 B2
(45) Date of Patent: May 17, 2016

(54) CHAMBER SEALING MEMBER

(71) Applicant: ASM IP Holding B.V., Almere (NL)

(72) Inventors: Michael Halpin, Scottsdale, AZ (US); Eric Shero, Phoenix, AZ (US); Carl White, Gilbert, AZ (US); Fred Alokozai, Scottsdale, AZ (US); Jerry Winkler, Gilbert, AZ (US); Todd Dunn, Cave Creek, AZ (US)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 14/634,342

(22) Filed: Feb. 27, 2015

(65) Prior Publication Data

US 2015/0167159 A1   Jun. 18, 2015

Related U.S. Application Data

(63) Continuation of application No. 13/677,151, filed on Nov. 14, 2012, now Pat. No. 9,005,539.

(60) Provisional application No. 61/563,232, filed on Nov. 23, 2011.

(51) Int. Cl.

| | |
|---|---|
| *B01J 19/00* | (2006.01) |
| *C23C 16/44* | (2006.01) |
| *B01J 8/00* | (2006.01) |
| *H01L 21/67* | (2006.01) |
| *C23C 16/458* | (2006.01) |

(52) U.S. Cl.
CPC ........... *C23C 16/4409* (2013.01); *B01J 8/0035* (2013.01); *B01J 19/0073* (2013.01); *C23C 16/4585* (2013.01); *H01L 21/67126* (2013.01)

(58) Field of Classification Search
CPC ................ B01J 19/0073; B01J 8/0035; H01L 21/67126; C23C 16/4409
See application file for complete search history.

(56) References Cited

U.S. PATENT DOCUMENTS

| | | |
|---|---|---|
| 2,745,640 A | 5/1956 | Cushman |
| 2,990,045 A | 9/1959 | Root |
| 3,833,492 A | 9/1974 | Bollyky |
| 3,854,443 A | 12/1974 | Baerg |
| 3,862,397 A | 1/1975 | Anderson et al. |
| 3,887,790 A | 6/1975 | Ferguson |

(Continued)

FOREIGN PATENT DOCUMENTS

| | | |
|---|---|---|
| CN | 1563483 A | 1/2005 |
| CN | 101330015 A | 12/2008 |

(Continued)

OTHER PUBLICATIONS

USPTO; Final Office Action dated Apr. 15, 2015 in U.S. Appl. No. 13/187,300.

(Continued)

*Primary Examiner* — Lessanework Seifu
(74) *Attorney, Agent, or Firm* — Snell & Wilmer LLP

(57) ABSTRACT

A reaction chamber including an upper region for processing a substrate, a lower region for loading a substrate, a susceptor movable within the reaction chamber, a first sealing member positioned on a perimeter of the susceptor, a second sealing member positioned between the upper region and the lower region, wherein the first and second sealing members are selectively engaged with one another to limit communication between the upper region and the lower region.

23 Claims, 13 Drawing Sheets

(56) References Cited

U.S. PATENT DOCUMENTS

| | | |
|---|---|---|
| 4,058,430 A | 11/1977 | Suntola et al. |
| 4,176,630 A | 12/1979 | Elmer |
| 4,194,536 A | 3/1980 | Stine et al. |
| 4,322,592 A | 3/1982 | Martin |
| 4,389,973 A | 6/1983 | Suntola et al. |
| 4,393,013 A | 7/1983 | McMenamin |
| 4,436,674 A | 3/1984 | McMenamin |
| 4,499,354 A | 2/1985 | Hill et al. |
| 4,512,113 A | 4/1985 | Budinger |
| 4,570,328 A | 2/1986 | Price et al. |
| D288,556 S | 3/1987 | Wallgren |
| 4,653,541 A | 3/1987 | Oehlschlaeger et al. |
| 4,722,298 A | 2/1988 | Rubin et al. |
| 4,735,259 A | 4/1988 | Vincent |
| 4,753,192 A | 6/1988 | Goldsmith et al. |
| 4,789,294 A | 12/1988 | Sato et al. |
| 4,821,674 A | 4/1989 | deBoer et al. |
| 4,827,430 A | 5/1989 | Aid et al. |
| 4,882,199 A | 11/1989 | Sadoway et al. |
| 4,986,215 A | 1/1991 | Yamada |
| 4,991,614 A | 2/1991 | Hammel |
| 5,062,386 A | 11/1991 | Christensen |
| 5,074,017 A | 12/1991 | Toya et al. |
| 5,119,760 A | 6/1992 | McMillan et al. |
| 5,167,716 A | 12/1992 | Boitnott et al. |
| 5,199,603 A | 4/1993 | Prescott |
| 5,221,556 A | 6/1993 | Hawkins et al. |
| 5,242,539 A | 9/1993 | Kumihashi et al. |
| 5,243,195 A | 9/1993 | Nishi |
| 5,326,427 A | 7/1994 | Jerbic |
| 5,380,367 A | 1/1995 | Bertone |
| 5,421,893 A | 6/1995 | Perlov |
| 5,422,139 A | 6/1995 | Fischer |
| 5,518,549 A | 5/1996 | Hellwig |
| 5,595,606 A | 1/1997 | Fujikawa et al. |
| 5,632,919 A | 5/1997 | MacCracken et al. |
| 5,681,779 A | 10/1997 | Pasch et al. |
| 5,695,567 A | 12/1997 | Kordina |
| 5,730,801 A | 3/1998 | Tepman et al. |
| 5,732,744 A | 3/1998 | Barr et al. |
| 5,736,314 A | 4/1998 | Hayes et al. |
| 5,796,074 A | 8/1998 | Edelstein et al. |
| 5,836,483 A | 11/1998 | Disel |
| 5,837,320 A | 11/1998 | Hampden-Smith et al. |
| 5,855,680 A | 1/1999 | Soininen et al. |
| 5,920,798 A | 7/1999 | Higuchi et al. |
| 5,979,506 A | 11/1999 | Aarseth |
| 6,013,553 A | 1/2000 | Wallace |
| 6,015,465 A | 1/2000 | Kholodenko et al. |
| 6,035,101 A | 3/2000 | Sajoto et al. |
| 6,060,691 A | 5/2000 | Minami et al. |
| 6,074,443 A | 6/2000 | Venkatesh et al. |
| 6,083,321 A | 7/2000 | Lei et al. |
| 6,086,677 A | 7/2000 | Umotoy et al. |
| 6,122,036 A | 9/2000 | Yamasaki et al. |
| 6,125,789 A | 10/2000 | Gupta et al. |
| 6,129,044 A | 10/2000 | Zhao et al. |
| 6,148,761 A | 11/2000 | Majewski et al. |
| 6,160,244 A | 12/2000 | Ohashi |
| 6,161,500 A | 12/2000 | Kopacz et al. |
| 6,201,999 B1 | 3/2001 | Jevtic |
| 6,274,878 B1 | 8/2001 | Li et al. |
| 6,287,965 B1 | 9/2001 | Kang et al. |
| 6,302,964 B1 | 10/2001 | Umotoy et al. |
| 6,312,525 B1 | 11/2001 | Bright et al. |
| D451,893 S | 12/2001 | Robson |
| D452,220 S | 12/2001 | Robson |
| 6,326,597 B1 | 12/2001 | Lubomirsky et al. |
| 6,342,427 B1 | 1/2002 | Choi et al. |
| 6,367,410 B1 | 4/2002 | Leahey et al. |
| 6,368,987 B1 | 4/2002 | Kopacz et al. |
| 6,383,566 B1 | 5/2002 | Zagdoun |
| 6,410,459 B2 | 6/2002 | Blalock et al. |
| 6,420,279 B1 | 7/2002 | Ono et al. |
| 6,454,860 B2 | 9/2002 | Metzner et al. |
| 6,478,872 B1 | 11/2002 | Chae et al. |
| 6,482,331 B2 | 11/2002 | Lu et al. |
| 6,483,989 B1 | 11/2002 | Okada et al. |
| 6,511,539 B1 | 1/2003 | Raaijmakers |
| 6,521,295 B1 | 2/2003 | Remington |
| 6,534,395 B2 | 3/2003 | Werkhoven et al. |
| 6,569,239 B2 | 5/2003 | Arai et al. |
| 6,579,833 B1 | 6/2003 | McNallan et al. |
| 6,590,251 B2 | 7/2003 | Kang et al. |
| 6,594,550 B1 | 7/2003 | Okrah |
| 6,598,559 B1 | 7/2003 | Vellore et al. |
| 6,627,503 B2 | 9/2003 | Ma et al. |
| 6,633,364 B2 | 10/2003 | Hayashi |
| 6,645,304 B2 | 11/2003 | Yamaguchi |
| 6,648,974 B1 | 11/2003 | Ogliari et al. |
| 6,673,196 B1 | 1/2004 | Oyabu |
| 6,682,973 B1 | 1/2004 | Paton et al. |
| 6,709,989 B2 | 3/2004 | Ramdani et al. |
| 6,710,364 B2 | 3/2004 | Guldi et al. |
| 6,734,090 B2 | 5/2004 | Agarwala et al. |
| 6,820,570 B2 | 11/2004 | Kilpela et al. |
| 6,821,910 B2 | 11/2004 | Adomaitis et al. |
| 6,824,665 B2 | 11/2004 | Shipley et al. |
| 6,847,014 B1 | 1/2005 | Benjamin et al. |
| 6,858,524 B2 | 2/2005 | Haukka et al. |
| 6,858,547 B2 | 2/2005 | Metzner |
| 6,863,019 B2 | 3/2005 | Shamouilian |
| 6,874,480 B1 | 4/2005 | Ismailov |
| 6,875,677 B1 | 4/2005 | Conley, Jr. et al. |
| 6,884,066 B2 | 4/2005 | Nguyen et al. |
| 6,884,319 B2 | 4/2005 | Kim |
| 6,889,864 B2 | 5/2005 | Lindfors et al. |
| 6,909,839 B2 | 6/2005 | Wang et al. |
| 6,930,059 B2 | 8/2005 | Conley, Jr. et al. |
| 6,935,269 B2 | 8/2005 | Lee et al. |
| 6,955,836 B2 | 10/2005 | Kumagai et al. |
| 6,972,478 B1 | 12/2005 | Waite et al. |
| 7,045,430 B2 | 5/2006 | Ahn et al. |
| 7,053,009 B2 | 5/2006 | Conley, Jr. et al. |
| 7,071,051 B1 | 7/2006 | Jeon et al. |
| 7,115,838 B2 | 10/2006 | Kurara et al. |
| 7,122,085 B2 | 10/2006 | Shero et al. |
| 7,129,165 B2 | 10/2006 | Basol et al. |
| 7,132,360 B2 | 11/2006 | Schaeffer et al. |
| 7,135,421 B2 | 11/2006 | Ahn et al. |
| 7,147,766 B2 | 12/2006 | Uzoh et al. |
| 7,172,497 B2 | 2/2007 | Basol et al. |
| 7,192,824 B2 | 3/2007 | Ahn et al. |
| 7,192,892 B2 | 3/2007 | Ahn et al. |
| 7,195,693 B2 | 3/2007 | Cowans |
| 7,204,887 B2 | 4/2007 | Kawamura et al. |
| 7,205,247 B2 | 4/2007 | Lee et al. |
| 7,235,501 B2 | 6/2007 | Ahn et al. |
| D553,104 S | 10/2007 | Oohashi et al. |
| 7,298,009 B2 | 11/2007 | Yan et al. |
| D557,226 S | 12/2007 | Uchino et al. |
| 7,312,494 B2 | 12/2007 | Ahn et al. |
| 7,329,947 B2 | 2/2008 | Adachi et al. |
| 7,357,138 B2 | 4/2008 | Ji et al. |
| 7,393,418 B2 | 7/2008 | Yokogawa |
| 7,393,736 B2 | 7/2008 | Ahn et al. |
| 7,402,534 B2 | 7/2008 | Mahajani |
| 7,405,166 B2 | 7/2008 | Liang et al. |
| 7,405,454 B2 | 7/2008 | Ahn et al. |
| 7,414,281 B1 | 8/2008 | Fastow |
| 7,437,060 B2 | 10/2008 | Wang et al. |
| 7,442,275 B2 | 10/2008 | Cowans |
| 7,489,389 B2 | 2/2009 | Shibazaki et al. |
| D593,969 S | 6/2009 | Li |
| 7,547,363 B2 | 6/2009 | Tomiyasu et al. |
| 7,575,968 B2 | 8/2009 | Sadaka et al. |
| 7,601,223 B2 | 10/2009 | Lindfors et al. |
| 7,601,225 B2 | 10/2009 | Tuominen et al. |
| 7,640,142 B2 | 12/2009 | Tachikawa et al. |
| 7,651,583 B2 | 1/2010 | Kent et al. |
| D609,655 S | 2/2010 | Sugimoto |
| 7,678,197 B2 | 3/2010 | Maki |
| D614,153 S | 4/2010 | Fondurulia et al. |
| 7,720,560 B2 | 5/2010 | Menser et al. |

(56) References Cited

U.S. PATENT DOCUMENTS

| | | |
|---|---|---|
| 7,723,648 B2 | 5/2010 | Tsukamoto et al. |
| 7,740,705 B2 | 6/2010 | Li |
| 7,780,440 B2 | 8/2010 | Shibagaki et al. |
| 7,833,353 B2 | 11/2010 | Furukawahara et al. |
| 7,851,019 B2 | 12/2010 | Tuominen et al. |
| 7,884,918 B2 | 2/2011 | Hattori |
| D634,719 S | 3/2011 | Yasuda et al. |
| 8,041,197 B2 | 10/2011 | Kasai et al. |
| 8,055,378 B2 | 11/2011 | Numakura |
| 8,071,451 B2 | 12/2011 | Berry |
| 8,071,452 B2 | 12/2011 | Raisanen |
| 8,072,578 B2 | 12/2011 | Yasuda et al. |
| 8,076,230 B2 | 12/2011 | Wei |
| 8,076,237 B2 | 12/2011 | Uzoh |
| 8,082,946 B2 | 12/2011 | Laverdiere et al. |
| 8,092,604 B2 | 1/2012 | Tomiyasu et al. |
| 8,137,462 B2 | 3/2012 | Fondurulia et al. |
| 8,147,242 B2 | 4/2012 | Shibagaki et al. |
| 8,216,380 B2 | 7/2012 | White et al. |
| 8,278,176 B2 | 10/2012 | Bauer et al. |
| 8,282,769 B2 | 10/2012 | Iizuka |
| 8,287,648 B2 | 10/2012 | Reed et al. |
| 8,293,016 B2 | 10/2012 | Bahng et al. |
| 8,309,173 B2 | 11/2012 | Tuominen et al. |
| 8,323,413 B2 | 12/2012 | Son |
| 8,367,528 B2 | 2/2013 | Bauer et al. |
| 8,372,204 B2 | 2/2013 | Nakamura |
| 8,444,120 B2 | 5/2013 | Gregg et al. |
| 8,506,713 B2 | 8/2013 | Takagi |
| D691,974 S | 10/2013 | Osada et al. |
| 8,608,885 B2 | 12/2013 | Goto et al. |
| 8,683,943 B2 | 4/2014 | Onodera et al. |
| 8,711,338 B2 | 4/2014 | Liu et al. |
| D705,745 S | 5/2014 | Kurs et al. |
| 8,726,837 B2 | 5/2014 | Patalay et al. |
| 8,728,832 B2 | 5/2014 | Raisanen et al. |
| 8,802,201 B2 | 8/2014 | Raisanen et al. |
| 8,821,640 B2 | 9/2014 | Cleary et al. |
| D716,742 S | 11/2014 | Jang et al. |
| 8,877,655 B2 | 11/2014 | Shero et al. |
| 8,883,270 B2 | 11/2014 | Shero et al. |
| 8,986,456 B2 | 3/2015 | Fondurulia et al. |
| 8,993,054 B2 | 3/2015 | Jung et al. |
| 9,005,539 B2 | 4/2015 | Halpin et al. |
| 9,017,481 B1 | 4/2015 | Pettinger et al. |
| 9,018,111 B2 | 4/2015 | Milligan et al. |
| 9,021,985 B2 | 5/2015 | Alokozai et al. |
| 9,029,253 B2 | 5/2015 | Milligan et al. |
| 2001/0017103 A1 | 8/2001 | Takeshita et al. |
| 2001/0046765 A1 | 11/2001 | Cappellani et al. |
| 2002/0001974 A1 | 1/2002 | Chan |
| 2002/0011210 A1 | 1/2002 | Satoh et al. |
| 2002/0064592 A1 | 5/2002 | Datta et al. |
| 2002/0098627 A1 | 7/2002 | Pomarede et al. |
| 2002/0108670 A1 | 8/2002 | Baker et al. |
| 2002/0115252 A1 | 8/2002 | Haukka et al. |
| 2002/0172768 A1 | 11/2002 | Endo et al. |
| 2002/0187650 A1 | 12/2002 | Blalock et al. |
| 2003/0019580 A1 | 1/2003 | Strang |
| 2003/0025146 A1 | 2/2003 | Narwankar et al. |
| 2003/0040158 A1 | 2/2003 | Saitoh |
| 2003/0042419 A1 | 3/2003 | Katsumata et al. |
| 2003/0066826 A1 | 4/2003 | Lee et al. |
| 2003/0075925 A1 | 4/2003 | Lindfors et al. |
| 2003/0094133 A1 | 5/2003 | Yoshidome et al. |
| 2003/0111963 A1 | 6/2003 | Tolmachev et al. |
| 2003/0141820 A1 | 7/2003 | White et al. |
| 2003/0228772 A1 | 12/2003 | Cowans |
| 2003/0232138 A1 | 12/2003 | Tuominen et al. |
| 2004/0013577 A1 | 1/2004 | Ganguli et al. |
| 2004/0023516 A1 | 2/2004 | Londergan et al. |
| 2004/0036129 A1 | 2/2004 | Forbes et al. |
| 2004/0077182 A1 | 4/2004 | Lim et al. |
| 2004/0106249 A1 | 6/2004 | Huotari |
| 2004/0144980 A1 | 7/2004 | Ahn et al. |
| 2004/0168627 A1 | 9/2004 | Conley et al. |
| 2004/0169032 A1 | 9/2004 | Murayama et al. |
| 2004/0198069 A1 | 10/2004 | Metzner et al. |
| 2004/0200499 A1 | 10/2004 | Harvey et al. |
| 2004/0219793 A1 | 11/2004 | Hishiya et al. |
| 2004/0221807 A1 | 11/2004 | Verghese et al. |
| 2004/0266011 A1 | 12/2004 | Lee et al. |
| 2005/0008799 A1 | 1/2005 | Tomiyasu et al. |
| 2005/0019026 A1 | 1/2005 | Wang et al. |
| 2005/0020071 A1 | 1/2005 | Sonobe et al. |
| 2005/0023624 A1 | 2/2005 | Ahn et al. |
| 2005/0054228 A1 | 3/2005 | March |
| 2005/0066893 A1 | 3/2005 | Soininen |
| 2005/0070123 A1 | 3/2005 | Hirano |
| 2005/0072357 A1 | 4/2005 | Shero et al. |
| 2005/0092249 A1 | 5/2005 | Kilpela et al. |
| 2005/0100669 A1 | 5/2005 | Kools et al. |
| 2005/0106893 A1 | 5/2005 | Wilk |
| 2005/0110069 A1 | 5/2005 | Kil et al. |
| 2005/0173003 A1 | 8/2005 | Laverdiere et al. |
| 2005/0187647 A1 | 8/2005 | Wang et al. |
| 2005/0212119 A1 | 9/2005 | Shero |
| 2005/0214457 A1 | 9/2005 | Schmitt et al. |
| 2005/0214458 A1 | 9/2005 | Meiere |
| 2005/0218462 A1 | 10/2005 | Ahn et al. |
| 2005/0229848 A1 | 10/2005 | Shinriki |
| 2005/0229972 A1 | 10/2005 | Hoshi et al. |
| 2005/0241176 A1 | 11/2005 | Shero et al. |
| 2005/0260347 A1 | 11/2005 | Narwankar et al. |
| 2005/0263075 A1 | 12/2005 | Wang et al. |
| 2005/0271813 A1 | 12/2005 | Kher et al. |
| 2005/0282101 A1 | 12/2005 | Adachi |
| 2006/0013946 A1 | 1/2006 | Park et al. |
| 2006/0014384 A1 | 1/2006 | Lee et al. |
| 2006/0019033 A1 | 1/2006 | Muthukrishnan et al. |
| 2006/0024439 A2 | 2/2006 | Tuominen et al. |
| 2006/0046518 A1 | 3/2006 | Hill et al. |
| 2006/0051925 A1 | 3/2006 | Ahn et al. |
| 2006/0060930 A1 | 3/2006 | Metz et al. |
| 2006/0062910 A1 | 3/2006 | Meiere |
| 2006/0063346 A1 | 3/2006 | Lee et al. |
| 2006/0068125 A1 | 3/2006 | Radhakrishnan |
| 2006/0110934 A1 | 5/2006 | Fukuchi |
| 2006/0113675 A1 | 6/2006 | Chang et al. |
| 2006/0128168 A1 | 6/2006 | Ahn et al. |
| 2006/0148180 A1 | 7/2006 | Ahn et al. |
| 2006/0193979 A1 | 8/2006 | Meiere et al. |
| 2006/0208215 A1 | 9/2006 | Metzner et al. |
| 2006/0213439 A1 | 9/2006 | Ishizaka |
| 2006/0223301 A1 | 10/2006 | Vanhaelemeersch et al. |
| 2006/0226117 A1 | 10/2006 | Bertram et al. |
| 2006/0228888 A1 | 10/2006 | Lee et al. |
| 2006/0240574 A1 | 10/2006 | Yoshie |
| 2006/0257563 A1 | 11/2006 | Doh et al. |
| 2006/0258078 A1 | 11/2006 | Lee et al. |
| 2006/0266289 A1 | 11/2006 | Verghese et al. |
| 2007/0010072 A1 | 1/2007 | Bailey et al. |
| 2007/0020953 A1 | 1/2007 | Tsai et al. |
| 2007/0022954 A1 | 2/2007 | Iizuka et al. |
| 2007/0028842 A1 | 2/2007 | Inagawa et al. |
| 2007/0031598 A1 | 2/2007 | Okuyama et al. |
| 2007/0031599 A1 | 2/2007 | Gschwandtner et al. |
| 2007/0037412 A1 | 2/2007 | Dip et al. |
| 2007/0042117 A1 | 2/2007 | Kupurao et al. |
| 2007/0049053 A1 | 3/2007 | Mahajani |
| 2007/0059948 A1 | 3/2007 | Metzner et al. |
| 2007/0065578 A1 | 3/2007 | McDougall |
| 2007/0066010 A1 | 3/2007 | Ando |
| 2007/0077355 A1 | 4/2007 | Chacin et al. |
| 2007/0084405 A1 | 4/2007 | Kim |
| 2007/0116873 A1 | 5/2007 | Li et al. |
| 2007/0134942 A1 | 6/2007 | Ahn et al. |
| 2007/0146621 A1 | 6/2007 | Yeom |
| 2007/0155138 A1 | 7/2007 | Tomasini et al. |
| 2007/0163440 A1 | 7/2007 | Kim et al. |
| 2007/0166457 A1 | 7/2007 | Yamoto et al. |
| 2007/0175397 A1 | 8/2007 | Tomiyasu et al. |
| 2007/0209590 A1 | 9/2007 | Li |
| 2007/0232501 A1 | 10/2007 | Tonomura |

(56) References Cited

U.S. PATENT DOCUMENTS

| | | |
|---|---|---|
| 2007/0249131 A1 | 10/2007 | Allen et al. |
| 2007/0252244 A1 | 11/2007 | Srividya et al. |
| 2007/0264807 A1 | 11/2007 | Leone et al. |
| 2008/0006208 A1 | 1/2008 | Ueno et al. |
| 2008/0029790 A1 | 2/2008 | Ahn et al. |
| 2008/0054332 A1 | 3/2008 | Kim et al. |
| 2008/0057659 A1 | 3/2008 | Forbes et al. |
| 2008/0069955 A1 | 3/2008 | Hong et al. |
| 2008/0075881 A1 | 3/2008 | Won et al. |
| 2008/0085226 A1 | 4/2008 | Fondurulia et al. |
| 2008/0113096 A1 | 5/2008 | Mahajani |
| 2008/0113097 A1 | 5/2008 | Mahajani et al. |
| 2008/0124908 A1 | 5/2008 | Forbes et al. |
| 2008/0149031 A1 | 6/2008 | Chu et al. |
| 2008/0176375 A1 | 7/2008 | Erben et al. |
| 2008/0216077 A1 | 9/2008 | Emani et al. |
| 2008/0224240 A1 | 9/2008 | Ahn et al. |
| 2008/0233288 A1 | 9/2008 | Clark |
| 2008/0248310 A1 | 10/2008 | Kim et al. |
| 2008/0261413 A1 | 10/2008 | Mahajani |
| 2008/0277715 A1 | 11/2008 | Ohmi et al. |
| 2008/0282970 A1 | 11/2008 | Heys et al. |
| 2008/0315292 A1 | 12/2008 | Ji et al. |
| 2009/0000550 A1 | 1/2009 | Tran et al. |
| 2009/0011608 A1 | 1/2009 | Nabatame |
| 2009/0020072 A1 | 1/2009 | Mizunaga et al. |
| 2009/0029564 A1 | 1/2009 | Yamashita et al. |
| 2009/0035947 A1 | 2/2009 | Horii |
| 2009/0061644 A1 | 3/2009 | Chiang et al. |
| 2009/0085156 A1 | 4/2009 | Dewey et al. |
| 2009/0093094 A1 | 4/2009 | Ye et al. |
| 2009/0095221 A1 | 4/2009 | Tam et al. |
| 2009/0107404 A1 | 4/2009 | Ogliari et al. |
| 2009/0136668 A1 | 5/2009 | Gregg et al. |
| 2009/0139657 A1 | 6/2009 | Lee et al. |
| 2009/0211523 A1 | 8/2009 | Kuppurao et al. |
| 2009/0211525 A1 | 8/2009 | Sarigiannis et al. |
| 2009/0239386 A1 | 9/2009 | Suzaki et al. |
| 2009/0242957 A1 | 10/2009 | Ma et al. |
| 2009/0246374 A1 | 10/2009 | Vukovic |
| 2009/0261331 A1 | 10/2009 | Yang et al. |
| 2009/0277510 A1 | 11/2009 | Shikata |
| 2009/0283041 A1 | 11/2009 | Tomiyasu et al. |
| 2009/0289300 A1 | 11/2009 | Sasaki et al. |
| 2010/0024727 A1 | 2/2010 | Kim et al. |
| 2010/0025796 A1 | 2/2010 | Dabiran |
| 2010/0055312 A1 | 3/2010 | Kato et al. |
| 2010/0075507 A1 | 3/2010 | Chang et al. |
| 2010/0102417 A1 | 4/2010 | Ganguli et al. |
| 2010/0124610 A1 | 5/2010 | Aikawa et al. |
| 2010/0130017 A1 | 5/2010 | Luo et al. |
| 2010/0170441 A1 | 7/2010 | Won et al. |
| 2010/0193501 A1 | 8/2010 | Zucker et al. |
| 2010/0230051 A1 | 9/2010 | Iizuka |
| 2010/0255198 A1 | 10/2010 | Cleary et al. |
| 2010/0275846 A1 | 11/2010 | Kitagawa |
| 2010/0294199 A1 | 11/2010 | Tran et al. |
| 2010/0307415 A1 | 12/2010 | Shero et al. |
| 2010/0322604 A1 | 12/2010 | Fondurulia et al. |
| 2011/0000619 A1 | 1/2011 | Suh |
| 2011/0061810 A1 | 3/2011 | Ganguly et al. |
| 2011/0070380 A1 | 3/2011 | Shero et al. |
| 2011/0097901 A1 | 4/2011 | Banna et al. |
| 2011/0108194 A1 | 5/2011 | Yoshioka et al. |
| 2011/0236600 A1 | 9/2011 | Fox et al. |
| 2011/0239936 A1 | 10/2011 | Suzaki et al. |
| 2011/0256734 A1 | 10/2011 | Hausmann et al. |
| 2011/0275166 A1 | 11/2011 | Shero et al. |
| 2011/0308460 A1 | 12/2011 | Hong et al. |
| 2012/0024479 A1 | 2/2012 | Palagashvili et al. |
| 2012/0070136 A1 | 3/2012 | Koelmel et al. |
| 2012/0070997 A1 | 3/2012 | Larson |
| 2012/0090704 A1 | 4/2012 | Laverdiere et al. |
| 2012/0098107 A1 | 4/2012 | Raisanen et al. |
| 2012/0114877 A1 | 5/2012 | Lee |
| 2012/0156108 A1 | 6/2012 | Fondurulia et al. |
| 2012/0160172 A1 | 6/2012 | Wamura et al. |
| 2012/0240858 A1 | 9/2012 | Taniyama et al. |
| 2012/0270393 A1 | 10/2012 | Pore et al. |
| 2012/0289053 A1 | 11/2012 | Holland et al. |
| 2012/0295427 A1 | 11/2012 | Bauer |
| 2012/0304935 A1 | 12/2012 | Oosterlaken et al. |
| 2012/0321786 A1 | 12/2012 | Satitpunwaycha et al. |
| 2013/0023129 A1 | 1/2013 | Reed |
| 2013/0081702 A1 | 4/2013 | Mohammed et al. |
| 2013/0104988 A1 | 5/2013 | Yednak et al. |
| 2013/0104992 A1 | 5/2013 | Yednak et al. |
| 2013/0115383 A1 | 5/2013 | Lu et al. |
| 2013/0126515 A1 | 5/2013 | Shero et al. |
| 2013/0129577 A1 | 5/2013 | Halpin et al. |
| 2013/0230814 A1 | 9/2013 | Dunn et al. |
| 2013/0264659 A1 | 10/2013 | Jung |
| 2013/0292676 A1 | 11/2013 | Milligan et al. |
| 2013/0292807 A1 | 11/2013 | Raisanen et al. |
| 2014/0000843 A1 | 1/2014 | Dunn et al. |
| 2014/0014644 A1 | 1/2014 | Akiba et al. |
| 2014/0027884 A1 | 1/2014 | Tang et al. |
| 2014/0036274 A1 | 2/2014 | Marquardt et al. |
| 2014/0060147 A1 | 3/2014 | Sarin et al. |
| 2014/0067110 A1 | 3/2014 | Lawson et al. |
| 2014/0073143 A1 | 3/2014 | Alokozai et al. |
| 2014/0084341 A1 | 3/2014 | Weeks |
| 2014/0103145 A1 | 4/2014 | White et al. |
| 2014/0120487 A1 | 5/2014 | Kaneko |
| 2014/0159170 A1 | 6/2014 | Raisanen et al. |
| 2014/0175054 A1 | 6/2014 | Carlson et al. |
| 2014/0217065 A1 | 8/2014 | Winkler et al. |
| 2014/0220247 A1 | 8/2014 | Haukka et al. |
| 2014/0251953 A1 | 9/2014 | Winkler et al. |
| 2014/0251954 A1 | 9/2014 | Winkler et al. |
| 2014/0346650 A1 | 11/2014 | Raisanen et al. |
| 2015/0004316 A1 | 1/2015 | Thompson et al. |
| 2015/0024609 A1 | 1/2015 | Milligan et al. |
| 2015/0048485 A1 | 2/2015 | Tolle |
| 2015/0091057 A1 | 4/2015 | Xie et al. |
| 2015/0096973 A1 | 4/2015 | Dunn et al. |
| 2015/0140210 A1 | 5/2015 | Jung et al. |
| 2015/0147877 A1 | 5/2015 | Jung |

FOREIGN PATENT DOCUMENTS

| | | |
|---|---|---|
| CN | 101522943 | 9/2009 |
| CN | 101423937 | 9/2011 |
| JP | H07283149 | 10/1995 |
| JP | H08335558 | 12/1996 |
| JP | 2001342570 | 12/2001 |
| JP | 2004014952 | 1/2004 |
| JP | 2004091848 | 3/2004 |
| JP | 2004538374 | 12/2004 |
| JP | 2005507030 | 3/2005 |
| JP | 2006186271 | 7/2006 |
| JP | 2008527748 | 7/2008 |
| TW | I226380 | 1/2005 |
| TW | 200701301 | 1/2007 |
| WO | 2006056091 | 6/2006 |
| WO | 2006078666 | 7/2006 |
| WO | 2010118051 | 10/2010 |
| WO | 2011019950 | 2/2011 |
| WO | 2013078065 | 5/2013 |
| WO | 2013078066 | 5/2013 |

OTHER PUBLICATIONS

USPTO; Final Office Action dated Mar. 20, 2015 in U.S. Appl. No. 13/312,591.

USPTO; Notice of Allowance dated May 14, 2015 in U.S. Appl. No. 13/312,591.

USPTO; Final Office Action dated Mar. 13, 2015 in U.S. Appl. No. 13/597,043.

USPTO; Final Office Action dated Jun. 1, 2015 in U.S. Appl. No. 13/597,108.

USPTO; Non-Final Office Action dated May 28, 2015 in U.S. Appl. No. 13/651,144.

(56) References Cited

OTHER PUBLICATIONS

USPTO; Non-Final Office Action dated Apr. 3, 2015 in U.S. Appl. No. 13/677,133.
USPTO; Final Office Action dated Mar. 25, 2015 in U.S. Appl. No. 13/791,246.
USPTO; Notice of Allowance dated Mar. 10, 2015 in U.S. Appl. No. 13/874,708.
USPTO; Restriction Requirement dated Apr. 30, 2015 in U.S. Appl. No. 13/941,216.
USPTO; Non-Final Office Action dated Apr. 7, 2015 in U.S. Appl. No. 14/018,345.
USPTO; Non-Final Office Action dated Apr. 28, 2015 in U.S. Appl. No. 14/040,196.
USPTO; Non-Final Office Action dated Mar. 19, 2015 in U.S. Appl. No. 14/079,302.
USPTO; Non-Final Office Action dated Mar. 19, 2015 in U.S. Appl. No. 14/166,462.
USPTO; Non-Final Office Action dated Mar. 16, 2015 in U.S. Appl. No. 14/183,187.
USPTO; Non-Final Office Action dated Mar. 16, 2015 in U.S. Appl. No. 29/447,298.
Bearzotti, et al., "Fast Humidity Response of a Metal Halide-Doped Novel Polymer," Sensors and Actuators B, 7, pp. 451-454, (1992).
Crowell, "Chemical methods of thin film deposition: Chemical vapor deposition, atomic layer deposition, and related technologies," Journal of Vacuum Science & Technology A 21.5, (2003): S88-S95.
Varma, et al., "Effect of Mtal Halides on Thermal, Mechanical, and Electrical Properties of Polypyromelitimide Films," Journal of Applied Polymer Science, vol. 32, pp. 3987-4000, (1986).
USPTO; Office Action dated Aug. 27, 2010 in U.S. Appl. No. 12/118,596.
USPTO; Office Action dated Feb. 15, 2011 in U.S. Appl. No. 12/118,596.
USPTO; Notice of Allowance dated Aug. 4, 2011 in U.S. Appl. No. 12/118,596.
USPTO; Notice of Allowance dated Jun. 16, 2011 in U.S. Appl. No. 12/430,751.
USPTO; Notice of Allowance dated Jul. 27, 2011 in U.S. Appl. No. 12/430,751.
USPTO; Restriction Requirement dated Jan. 15, 2013 in U.S. Appl. No. 12/754,223.
USPTO; Office Action dated Feb. 26, 2013 in U.S. Appl. No. 12/754,223.
USPTO; Final Office Action dated Jun. 28, 2013 in U.S. Appl. No. 12/754,223.
USPTO; Office Action dated Feb. 25, 2014 in U.S. Appl. No. 12/754,223.
USPTO; Final Office Action dated Jul. 14, 2014 in U.S. Appl. No. 12/754,223.
USPTO; Office Action dated Apr. 23, 2013 in U.S. Appl. No. 12/763,037.
USPTO; Final Office Action dated Oct. 21, 2013 in U.S. Appl. No. 12/763,037.
USPTO; Office Action dated Oct. 8, 2014 in U.S. Appl. No. 12/763,037.
USPTO; Notice of Allowance dated Jan. 27, 2015 in U.S. Appl. No. 12/763,037.
USPTO; Restriction Requirement dated Sep. 25, 2012 in U.S. Appl. No. 12/854,818.
USPTO; Office Action dated Dec. 6, 2012 in U.S. Appl. No. 12/854,818.
USPTO; Final Office Action dated Mar. 13, 2013 in U.S. Appl. No. 12/854,818.
USPTO; Office Action dated Aug. 30, 2013 in U.S. Appl. No. 12/854,818.
USPTO; Final Office Action dated Mar. 26, 2014 in U.S. Appl. No. 12/854,818.
USPTO; Office Action dated Jun. 3, 2014 in U.S. Appl. No. 12/854,818.
USPTO; Restriction Requirement dated May 8, 2013 in U.S. Appl. No. 13/102,980.
USPTO; Office Action dated Oct. 7, 2013 in U.S. Appl. No. 13/102,980.
USPTO; Final Office Action dated Mar. 25, 2014 in U.S. Appl. No. 13/102,980.
USPTO; Notice of Allowance dated Jul. 3, 2014 in U.S. Appl. No. 13/102,980.
USPTO; Non-Final Office Action dated Sep. 17, 2014 in U.S. Appl. No. 13/187,300.
USPTO; Non-Final Office Action dated Jul. 2, 2014 in U.S. Appl. No. 13/283,408.
USPTO; Final Office Action dated Jan. 29, 2015 in U.S. Appl. No. 13/283,408.
USPTO; Restriction Requirement dated Dec. 16, 2013 in U.S. Appl. No. 13/284,642.
USPTO; Restriction Requirement dated Apr. 21, 2014 in U.S. Appl. No. 13/284,642.
USPTO; Office Action dated Jul. 30, 2014 in U.S. Appl. No. 13/284,642.
USPTO; Notice of Allowance dated Feb. 11, 2015 in U.S. Appl. No. 13/284,642.
USPTO; Office Action dated Jan. 28, 2014 in U.S. Appl. No. 13/312,591.
USPTO; Final Office Action dated May 14, 2014 in U.S. Appl. No. 13/312,591.
USPTO; Non-Final Office Action dated Nov. 26, 2014 in U.S. Appl. No. 13/312,591.
USPTO; Office Action dated Jan. 10, 2013 in U.S. Appl. No. 13/339,609.
USPTO; Office Action dated Feb. 11, 2013 in U.S. Appl. No. 13/339,609.
USPTO; Final Office Action dated May 17, 2013 in U.S. Appl. No. 13/339,609.
USPTO; Office Action dated Aug. 29, 2013 in U.S. Appl. No. 13/339,609.
USPTO; Final Office Action dated Dec. 18, 2013 in U.S. Appl. No. 13/339,609.
USPTO; Notice of Allowance dated Apr. 7, 2014 in U.S. Appl. No. 13/339,609.
USPTO; Office Action dated Feb. 13, 2014 in U.S. Appl. No. 13/411,271.
USPTO; Office Action dated Jul. 31, 2014 in U.S. Appl. No. 13/411,271.
USPTO; Final Office Action dated Jan. 16, 2015 in U.S. Appl. No. 13/411,271.
USPTO; Restriction Requirement dated Oct. 29, 2013 in U.S. Appl. No. 13/439,528.
USPTO; Office Action dated Feb. 4, 2014 in U.S. Appl. No. 13/439,528.
USPTO; Final Office Action dated Jul. 8, 2014 in U.S. Appl. No. 13/439,528.
UPPTO; Notice of Allowance dated Oct. 21, 2014 in U.S. Appl. No. 13/439,528.
USPTO; Office Action dated May 23, 2013 in U.S. Appl. No. 13/465,340.
USPTO; Final Office Action dated Oct. 30, 2013 in U.S. Appl. No. 13/465,340.
USPTO; Notice of Allowance dated Feb. 12, 2014 in U.S. Appl. No. 13/465,340.
USPTO; Office Action dated Dec. 20, 2013 in U.S. Appl. No. 13/535,214.
USPTO; Final Office Action dated Jun. 18, 2014 in U.S. Appl. No. 13/535,214.
USPTO; Notice of Allowance dated Oct. 23, 2014 in U.S. Appl. No. 13/535,214.
USPTO; Non-Final Office Action dated Aug. 8, 2014 in U.S. Appl. No. 13/563,066.
USPTO; Final Office Action dated Feb. 12, 2015 in U.S. Appl. No. 13/563,066.
USPTO; Non-Final Office Action dated Oct. 15, 2014 in U.S. Appl. No. 13/597,043.

(56) References Cited

OTHER PUBLICATIONS

USPTO; Non-Final Office Action dated Feb. 12, 2015 in U.S. Appl. No. 13/597,108.
USPTO; Office Action dated Nov. 15, 2013 in U.S. Appl. No. 13/612,538.
USPTO; Office Action dated Jul. 10, 2014 in U.S. Appl. No. 13/612,538.
USPTO; Office Action dated Jun. 2, 2014 in U.S. Appl. No. 13/677,151.
USPTO; Final Office Action dated Nov. 14, 2014 in U.S. Appl. No. 13/677,151.
USPTO; Notice of Allowance dated Feb. 26, 2015 in U.S. Appl. No. 13/677,151.
USPTO; Office Action dated Apr. 24, 2014 in U.S. Appl. No. 13/784,362.
USPTO; Notice of Allowance dated Aug. 13, 2014 in U.S. Appl. No. 13/784,362.
USPTO; Restriction Requirement dated Jun. 26, 2014 in U.S. Appl. No. 13/874,708.
USPTO; Non-Final Office Action dated Oct. 9, 2014 in U.S. Appl. No. 13/874,708.
USPTO; Restriction Requirement dated May 8, 2014 in U.S. Appl. No. 13/791,246.
USPTO; Non-Final Office Action dated Sep. 19, 2014 in U.S. Appl. No. 13/791,246.
USPTO; Non-Final Office Action dated Sep. 12, 2014 in U.S. Appl. No. 13/941,134.
USPTO; Notice of Allowance dated Jan. 20, 2015 in U.S. Appl. No. 13/941,134.
USPTO; Restriction Requirement dated Sep. 16, 2014 in U.S. Appl. No. 13/948,055.
USPTO; Non-Final Office Action dated Oct. 30, 2014 in U.S. Appl. No. 13/948,055.
USPTO; Restriction Requirement Action dated Jan. 28, 2015 in Application No. 14/018,345.
USPTO; Office Action dated May 29, 2014 in Application No. 14/183,187.
USPTO; Final Office Action dated Nov. 7, 2014 in U.S. Appl. No. 14/183,187.
USPTO; Non-Final Office Action dated Feb. 12, 2015 in U.S. Appl. No. 14/457,058.
USPTO; Non-Final Office Action dated Jan. 16, 2015 in U.S. Appl. No. 14/563,044.
PCT; International Search report and Written Opinion dated Nov. 12, 2010 in Application No. PCT/US2010/030126.
PCT; International Preliminary Report on Patentability dated Oct. 11, 2011 Application No. PCT/US2010/030126.
PCT; International Search report and Written Opinion dated Jan. 12, 2011 in Application No. PCT/US2010/045368.
PCT; International Search report and Written Opinion dated Feb. 6, 2013 in Application No. PCT/US2012/065343.
PCT; International Search report and Written Opinion dated Feb. 13, 2013 in Application No. PCT/US2012/065347.
Chinese Patent Office; Office Action dated Jan. 10, 2013 in Application No. 201080015699.9.
Chinese Patent Office; Office Action dated Jan. 12, 2015 in Application No. 201080015699.9.
Chinese Patent Office; Notice on the First Office Action dated May 24, 2013 in Application No. 201080036764.6.
Chinese Patent Office; Notice on the Second Office Action dated Jan. 2, 2014 in Application No. 201080036764.6.
Chinese Patent Office; Notice on the Third Office Action dated Jul. 1, 2014 in Application No. 201080036764.6.
Chinese Patent Office; Notice on the First Office Action dated Feb. 8, 2014 in Application No. 201110155056.
Chinese Patent Office; Notice on the Second Office Action dated Sep. 16, 2014 in Application No. 201110155056.
Chinese Patent Office; Notice on the Third Office Action dated Feb. 9, 2015 in Application No. 201110155056.
Japanese Patent Office; Office Action dated Jan. 25, 2014 in Application No. 2012-504786.
Japanese Patent Office; Office Action dated Dec. 1, 2014 in Application No. 2012-504786.
Taiwan Patent Office; Office Action dated Jul. 4, 2014 in Application No. 099110511.
Taiwan Patent Office; Office Action dated Dec. 30, 2014 in Application No. 099114330.
Taiwan Patent Office; Office Action dated Dec. 19, 2014 in Application No. 099127063.
Chang et al. Small-Subthreshold-Swing and Low-Voltage Flexible Organic Thin-Film Transistors Which Use HfLaO as the Gate Dielectric; IEEE Electron Device Letters; Feb. 2009; 133-135; vol. 30, No. 2; IEEE Electron Device Society.
Koutsokeras et al. Texture and Microstructure Evolution in Single-Phase TixTal-xN Alloys of Rocksalt Structure. Journal of Applied Physics, 110, pp. 043535-1-043535-6, (2011).
Maeng et al. Electrical properties of atomic layer disposition Hf02 and Hf0xNy on Si substrates with various crystal orientations, Journal of the Electrochemical Society, Apr. 2008, p. H267-H271, vol. 155, No. 4, Department of Materials Science and Engineering, Pohang University of Science and Technology, Pohang, Korea.
Novaro et al. Theoretical Study on a Reaction Pathway of Ziegler-Natta-Type Catalysis, J. Chem. Phys. 68(5), Mar. 1, 1978 p. 2337-2351.

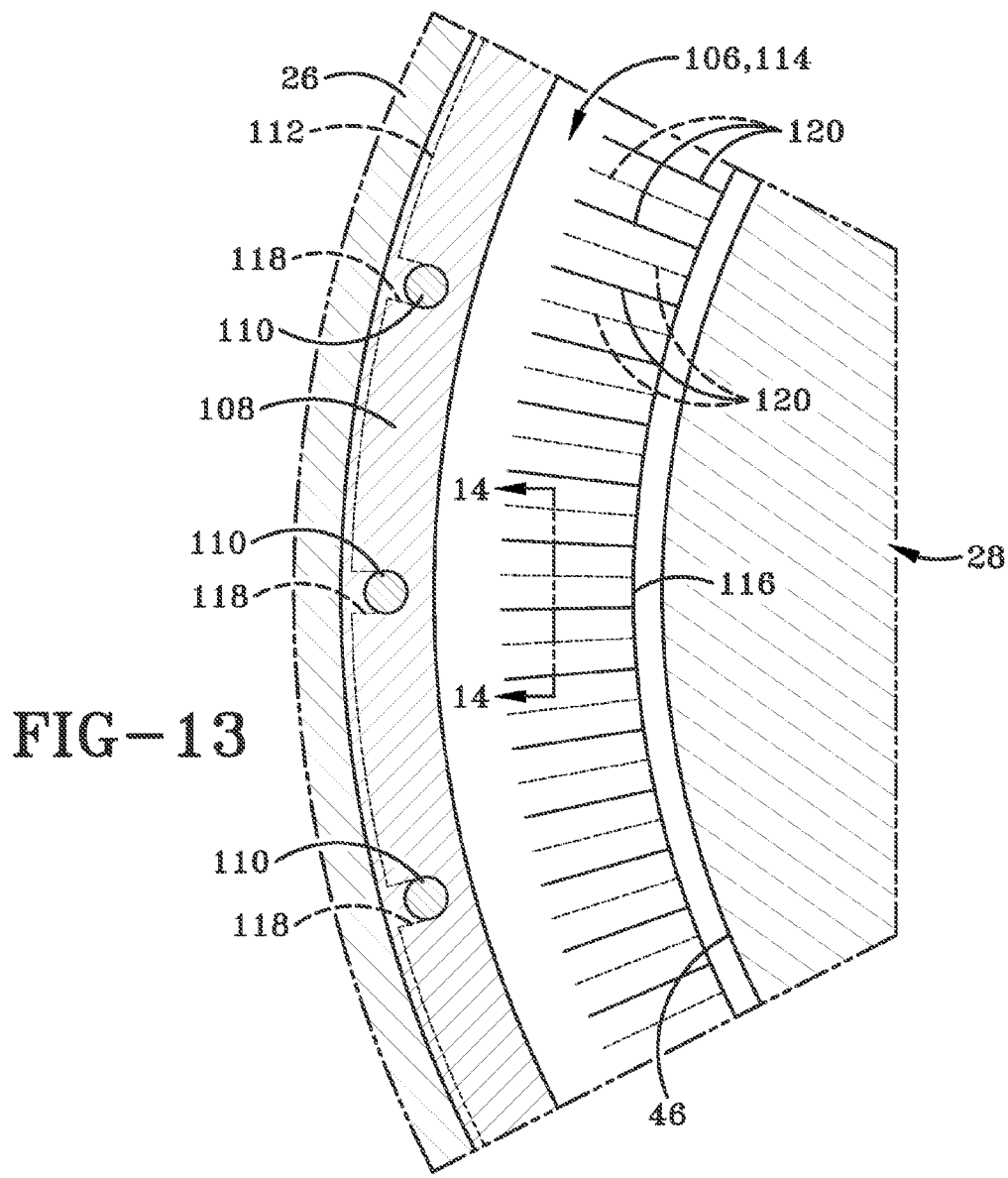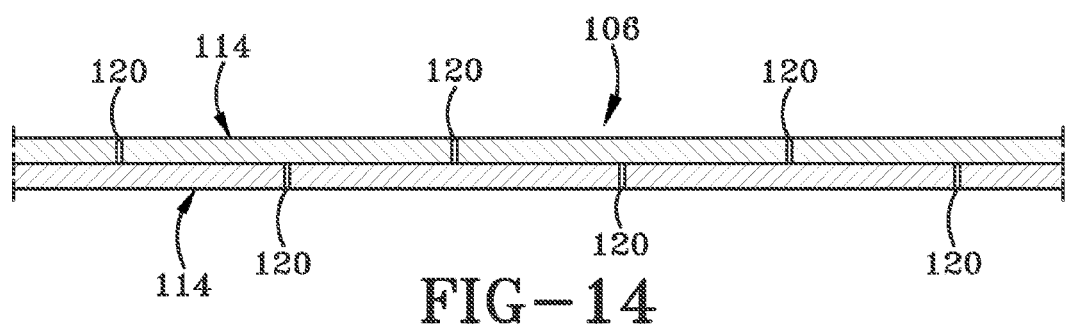

CHAMBER SEALING MEMBER

CROSS-REFERENCE TO RELATED APPLICATIONS

This Application is a continuation of and claims priority to U.S. patent application Ser. No. 13/677,151, filed Nov. 14, 2012, which claims the benefit of U.S. Provisional Application No. 61/563,232, filed on Nov. 23, 2011, the disclosures of which are hereby incorporated herein by reference.

BACKGROUND

Thin film deposition reaction chambers are generally manufactured with a single chamber or a dual chamber. In the dual chamber arrangement, the two chambers may be oriented with one chamber vertically above the second chamber. The upper chamber is used for the processing of the substrate, while the lower chamber is used for substrate loading and unloading. A regularly occurring issue in dual chamber reactors is deposition particles coating the lower chamber walls and requiring more frequent chamber cleaning.

It can also be difficult to heat a substrate being processed in a substrate processing tool. Variation in substrate heating may lead to within-substrate temperature variations. Such within-substrate temperature variations may lead to within-substrate processing non-uniformities. In some settings, substrates exhibiting such non-uniformities may produce defective devices. Further, deposition product may be deposited in the lower processing chamber, leading to reduced temperatures in the reaction chamber and therefore increased power consumption to overcome the inadequate heating. Additionally, the build-up of deposition product in the chamber can lead to premature chamber cleaning requirements and increased costs.

SUMMARY

Aspects of this document relate to reaction chambers for processing substrates. In one aspect, a reaction chamber including an upper region for processing a substrate, a lower region for loading a substrate, a susceptor movable within the reaction chamber, a first sealing member positioned on a perimeter of the susceptor, a second sealing member positioned between the upper region and the lower region, wherein the first and second sealing members are selectively engaged with one another to limit communication between the upper region and the lower region.

In an implementation, the first sealing member may be removably positioned on the susceptor. The second sealing member may be removably positioned between the upper region and the lower region. The reaction chamber may further include a gap between a perimeter of the susceptor and the first sealing member. The gap may decrease when the reaction chamber is at a processing temperature. The first sealing member may travel vertically with the susceptor. The reaction chamber may further include a showerhead in the upper region, wherein the second sealing member is secured between the showerhead and the first sealing member. A processing gas may travel between the first sealing member and the second sealing member when the susceptor is in a processing position.

The first sealing member and the second sealing member may be composed of quartz. The sealing member may be self-centering on the susceptor. The first sealing member may further include at least one protrusion extending upward. The second sealing member may further include at least one protrusion extending downward. The first sealing member at least one protrusion and the second sealing member at least one protrusion may be nested together when the susceptor is in a processing position. A tortuous path may be defined between the first sealing member and the second sealing member. The first sealing member and the second sealing member at least one protrusions may each further include three protrusions.

The second sealing member may be flexible and the first sealing member may deflect the second sealing member when the susceptor is in a processing position. The second sealing member may be secured to the reaction chamber within the lower region. The second sealing member may further include a plurality of notches. The second sealing member may further include a plurality of radially aligned slits. The second sealing member may further include two second sealing members with radially aligned slits positioned offset from each other.

In another aspect, a reaction chamber isolation device includes a first sealing member movable within a reaction chamber and positionable on a susceptor, a second sealing member positionable within the reaction chamber between an upper region and a lower region, and wherein the first and second sealing members are selectively engageable with one another to limit communication between the upper region and the lower region.

In an implementation, the first sealing member may further include at least one protrusion extending upward and the second sealing member may further include at least one protrusion extending downward. The first sealing member at least one protrusion and the second sealing member at least one protrusion may be nested together when the susceptor is in a processing position. A tortuous path may be defined between the first sealing member and the second sealing member. The second sealing member is flexible and the first sealing member deflects the second sealing member when the susceptor is in a processing position.

Aspects and implementations of the disclosure presented here are described below in the drawings and detailed description. Unless specifically noted, it is intended that the words and phrases in the specification and the claims be given their plain, ordinary, and accustomed meaning to those of ordinary skill in the applicable arts. The inventors are fully aware that they can be their own lexicographers if desired. The inventors expressly elect, as their own lexicographers, to use only the plain and ordinary meaning of terms in the specification and claims unless they clearly state otherwise and then further, expressly set forth the "special" definition of that term and explain how it differs from the plain and ordinary meaning Absent such clear statements of intent to apply a "special" definition, it is the inventors' intent and desire that the simple, plain and ordinary meaning of the terms be applied to the interpretation of the specification and claims.

The inventors are also aware of the normal precepts of English grammar. Thus, if a noun, term, or phrase is intended to be further characterized, specified, or narrowed in some way, then such noun, term, or phrase will expressly include additional adjectives, descriptive terms, or other modifiers in accordance with the normal precepts of English grammar. Absent the use of such adjectives, descriptive terms, or modifiers, it is the intent that such nouns, terms, or phrases be given their plain, and ordinary English meaning to those skilled in the applicable arts as set forth above.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Embodiments of the present invention will hereinafter be described in conjunction with the appended drawings, where like designations denote like elements, and:

FIG. 13 schematically shows a sectional view taken generally about line 13-13 in FIG. 12.

FIG. 14 schematically shows a sectional view taken generally about line 14-14 in FIG. 13.

DETAILED DESCRIPTION

The present aspects and implementations may be described in terms of functional block components and various processing steps. Such functional blocks may be realized by any number of hardware or software components configured to perform the specified functions and achieve the various results. For example, the present aspects may employ various sensors, detectors, flow control devices, heaters, and the like, which may carry out a variety of functions. In addition, the present aspects and implementations may be practiced in conjunction with any number of processing methods, and the apparatus and systems described may employ any number of processing methods, and the apparatus and systems described are merely examples of applications of the invention.

Figure 1:
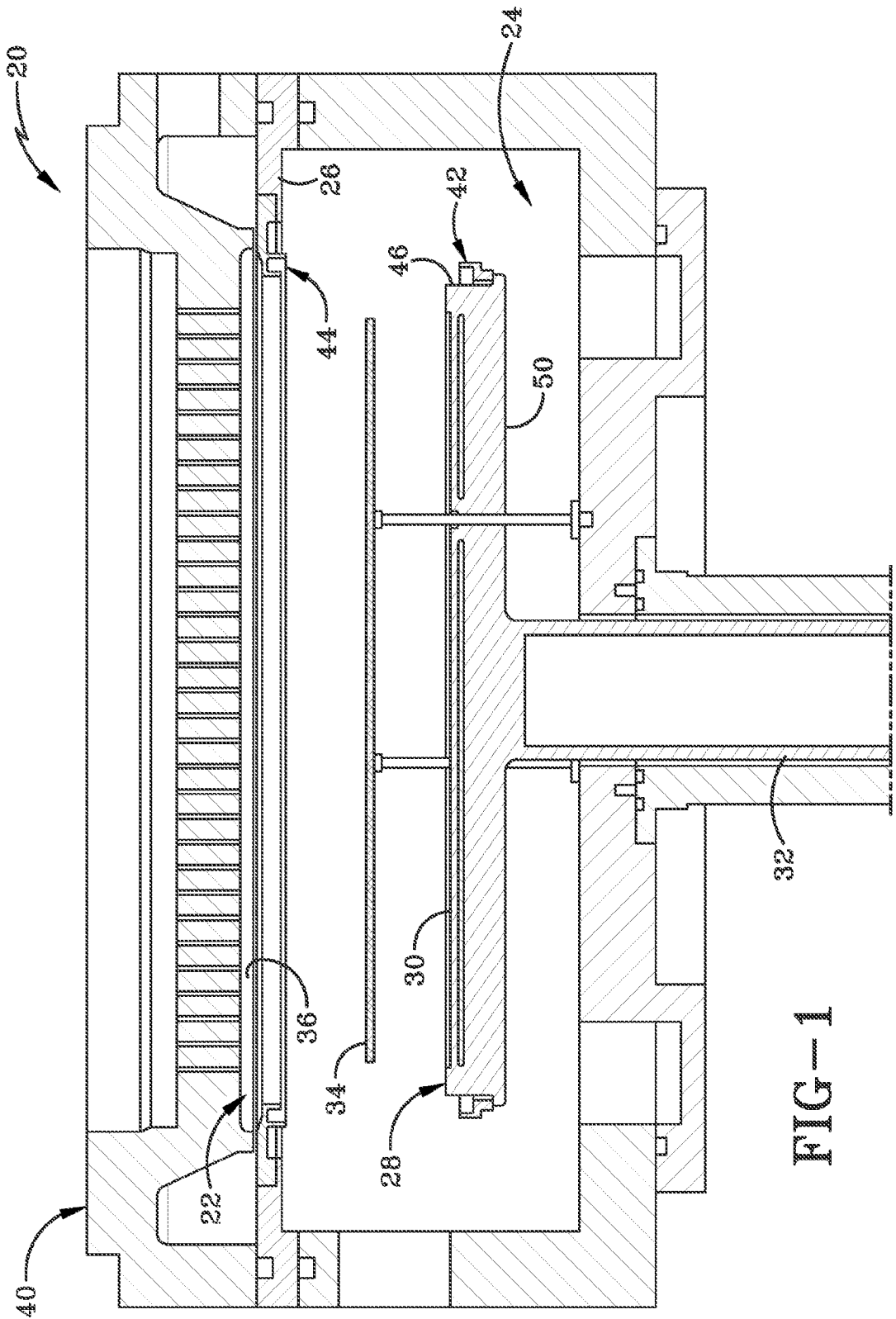
FIG. 1 schematically shows a substrate processing chamber including a first sealing member and a second sealing member in a substrate loading position.
Figure 2:
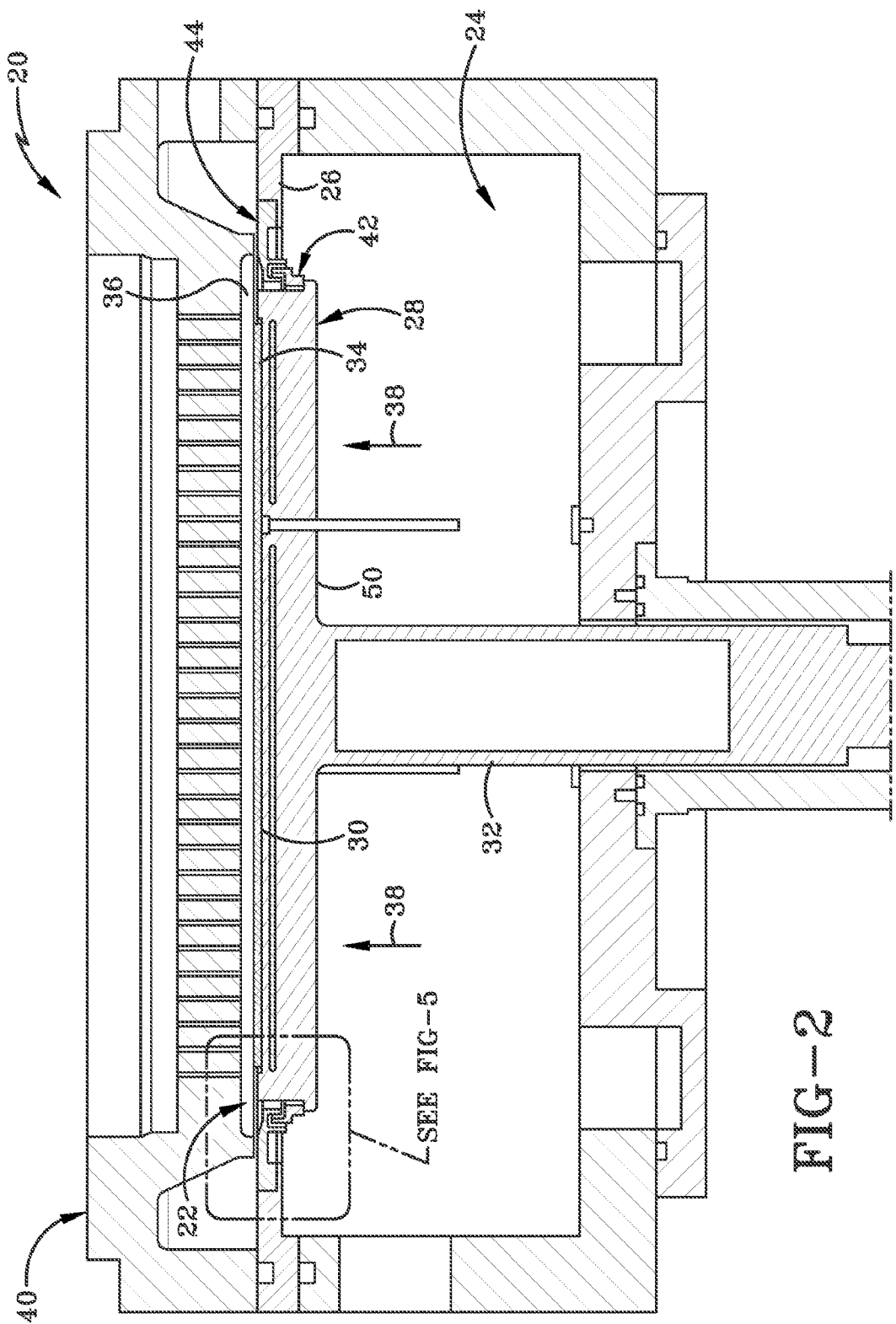
FIG. 2 schematically shows a substrate processing chamber with a susceptor, a first sealing member, and a second sealing member in a processing position.

FIGS. 1 and 2 illustrate views of a reaction chamber 20 in a loading/unloading position and a processing position, respectively. Reaction chamber 20 may include an upper region 22 and a lower region 24, which may be separated by an interface plate 26. In general, processing occurs within the upper region 22 while substrate loading and unloading occurs within lower region 24. A susceptor 28 includes a substrate mounting surface 30 and is connected to a vertically movable elevator 32 for displacing the susceptor between the substrate loading position and the substrate processing position. A substrate 34 may be positioned on substrate mounting surface 30 and may be located in a processing region 36 when positioned susceptor 28 is moved upwards in the direction of arrows 38 as shown in FIG. 2 with a showerhead 40 defining an upper surface of the processing region. As will be discussed in greater detail below, a first sealing member 42 may be positioned on and removable from susceptor 28, while a second sealing member 44 may be positioned between upper region 22 and lower region 24. Specifically, the second sealing member 44 may be positioned to rest at least partially on interface plate 26 or may connected to the interface plate or any other suitable portion of reaction chamber 20 without departing from the spirit and scope of the present disclosure.

Figure 3:
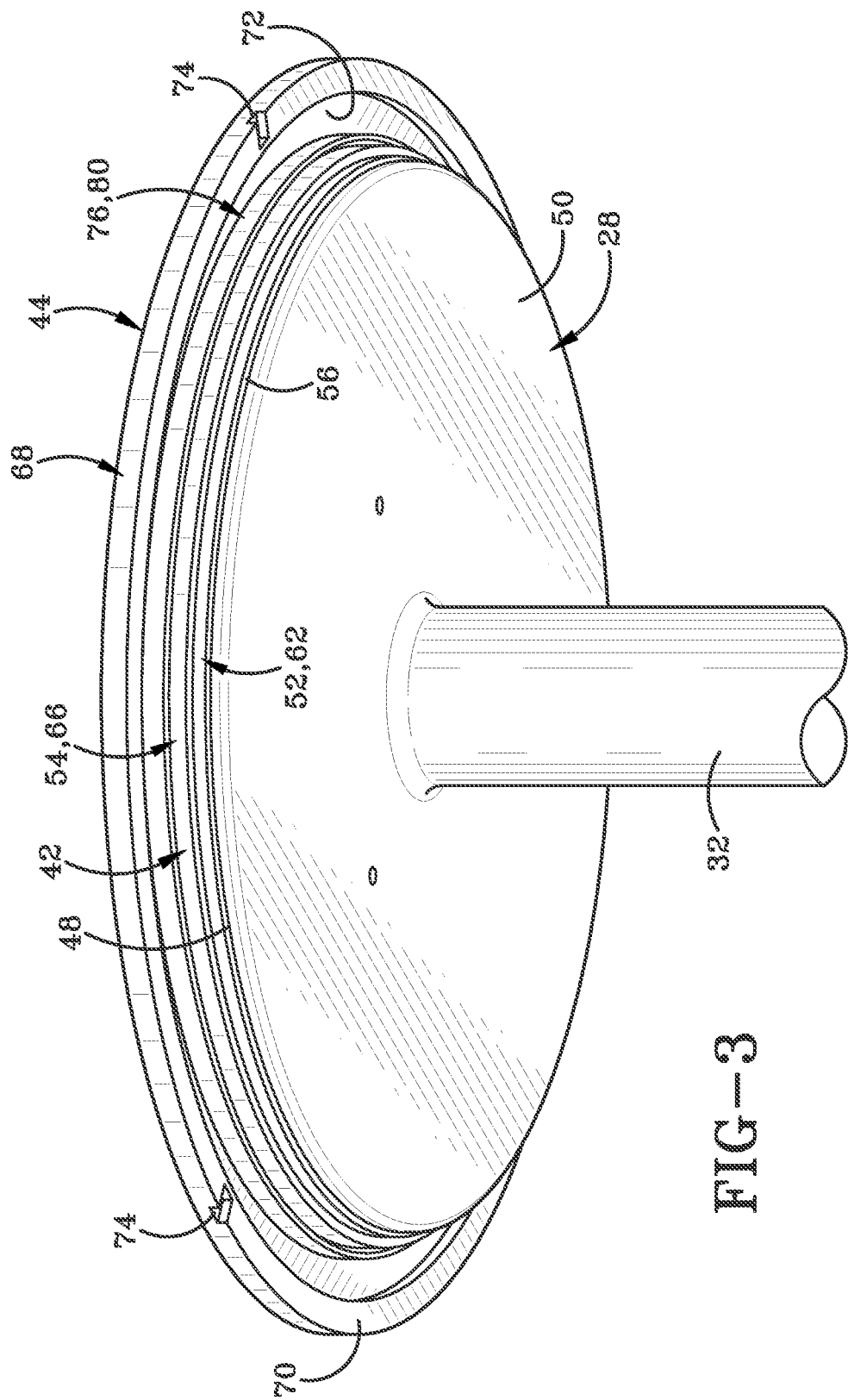
FIG. 3 schematically shows a bottom perspective view of a portion of the susceptor and sealing members.
Figure 4:
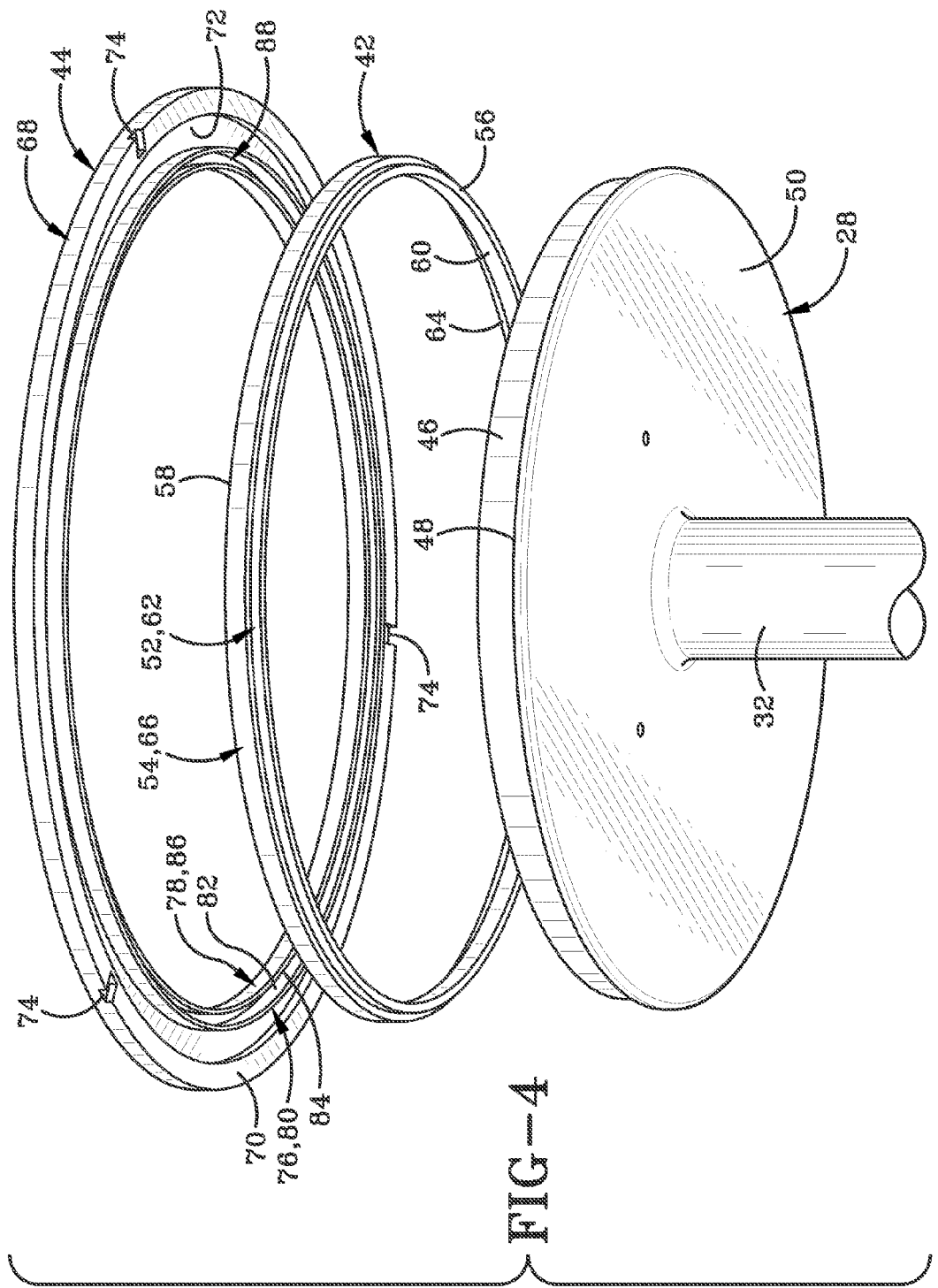
FIG. 4 schematically shows a perspective exploded view of the susceptor and sealing members.

Referring now to FIGS. 3 and 4, susceptor 28 is shown with the first sealing member 42 and the second sealing member 44 attached and detached, respectively. Susceptor 28 includes an outer surface 46 and a ledge 48 extending outward of the outer surface 46. Ledge 48 may be positioned generally near a lower surface 50 of the susceptor and is arranged to receive first sealing member 42 thereon. First sealing member 42 includes a lower portion 52 and an upper portion 54, with the lower portion being positioned generally radially inward of the upper portion 54 in one implementation, although any suitable arrangements may be utilized. Lower portion 52 may include a bottom surface 56 arranged to rest on ledge 48 of the susceptor 28 when the first sealing member is being used to separate the upper region 22 and the lower region 24. Upper portion 54 may include an upper surface 58 which assists with sealing by forming a portion of a tortuous path as will be discussed below in greater detail. Further, lower portion 52 may include an inner surface 60 and an outer surface 62, while upper portion 54 may include an inner surface 64 and an outer surface 66. Accordingly, upper portion 54 functions as a protrusion by extending upward from lower portion 52 as part of the first sealing member 42.

Second sealing member 44 may include an outer mounting ring 68 having a bottom surface 70, with the outer mounting ring 68 partially defining a channel 72. Bottom surface 70 is generally in contact with interface plate 26 when the second sealing member 44 is being used to provide separation between the upper region 22 and the lower region 24. Outer ring 68 may also include a plurality of notches 74 which can be used to insure constant and consistent alignment with the other components in the reaction chamber. The second sealing member 44 may also include an outer protrusion 76 and an inner protrusion 78 generally extending downward. The outer protrusion 76 may include an outer surface 80 and an inner surface 82, while inner protrusion 78 may include an outer surface 84 and an inner surface 86. In this arrangement, outer surface 80 of outer protrusion 76 further defines channel 72 in second sealing member 44, while outer surface 84 of inner protrusion 78 and inner surface 82 of outer protrusion 76 at least partially define a channel 88 for receiving upper portion 54 of the first sealing member 42 when the susceptor 28 travels upwards into the processing position. In one implementation, inner protrusion 78 and outer protrusion 76 may extend downward beyond bottom surface 70 since the bottom surface is positioned on an interface plate within the reaction chamber. In another implementation, the inner protrusion 78 may extend downwards a shorter distance than outer protrusion 76. A person of skill in the art will immediately appreciate that a number of changes can be made to the sealing members without departing from the spirit and scope of the disclosure.

Figure 5:
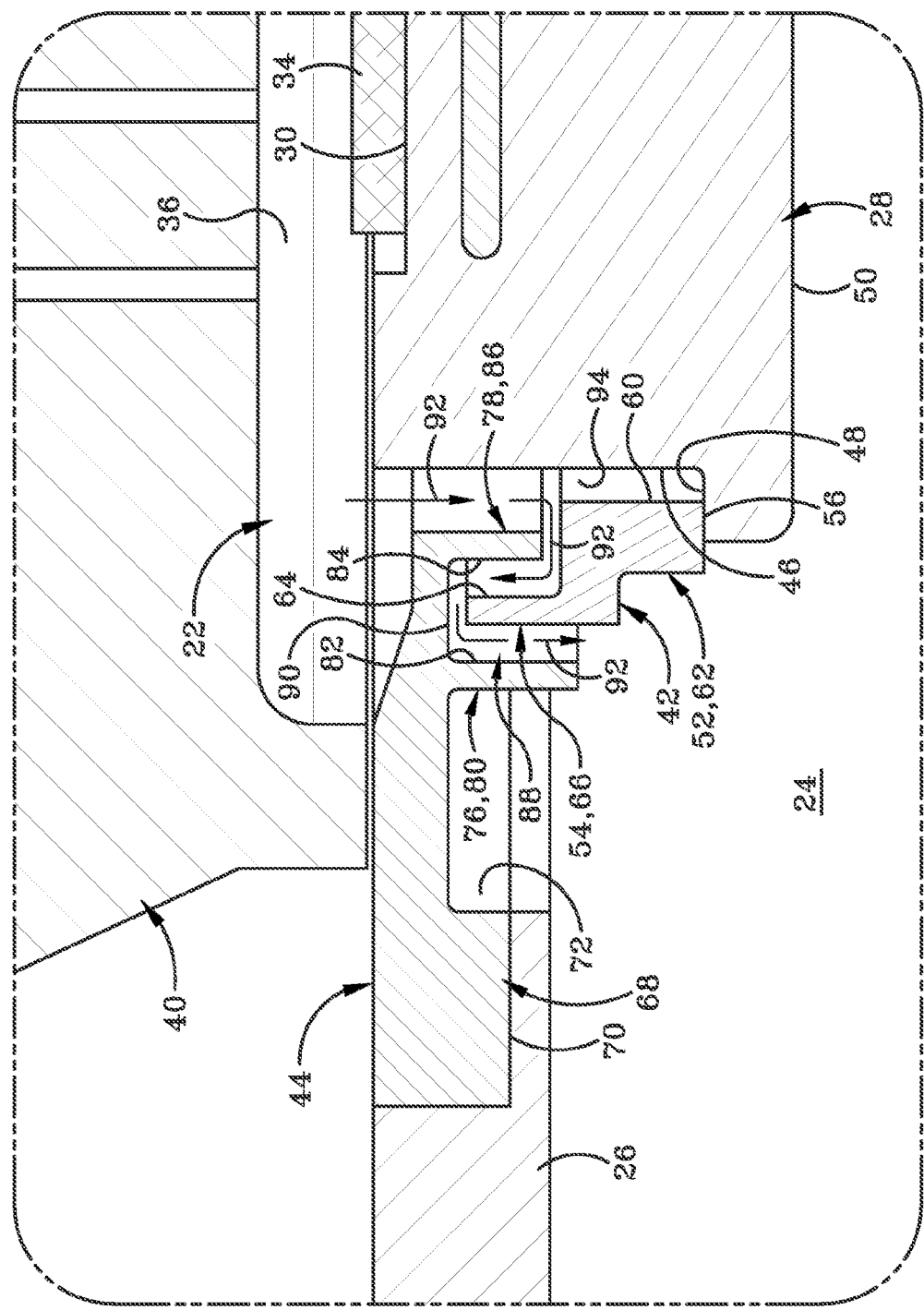
FIG. 5 schematically shows a sectional view of the area labeled FIG. 5 in FIG. 2.

FIG. 5 illustrates an enlarged sectional view of the first sealing member 42 nested within a portion of second sealing member 44 when susceptor 28 is moved upwards into a processing position. Specifically, upper portion 54 of first sealing member 42 is shown positioned within channel 88 formed at least partially between outer protrusion 76, inner protrusion 78, and a wall 90. A gas path indicated by arrows 92 is generally less susceptible to transmitting gases from within the upper region 22 to the lower region 24 due to the tortuous path created by the first and second sealing members. The gas must travel through the tortuous path defined by a gap 94 formed between inner surfaces 60 and 64 of first sealing member 42 and an outer surface 46 of susceptor 28, through channel 88 with upper portion 54 positioned therein, and finally into the lower region 24. The width and lengths of the tortuous path may be optimized to permit a variable amount of communication between the upper and lower regions, or no communication between the upper and lower regions depending on the processing requirements.

Both the first sealing member 42 and the second sealing member 44 may be composed of quartz, rutile, yttria, zirconia, Inconel, titanium, beryllium-copper, or any other suitable material. In some implementations, the first and second sealing members may increase or decrease in size depending on the temperature within reaction chamber 20. For example, when first sealing member 42 is composed of quartz, the first sealing member 42 tends to expand or grow when the temperature within the reaction chamber increases and particularly when the temperature increases near 400 degrees C. Further, when the first sealing member 42 grows, gap 94 may be decreased and the first sealing member 42 provides a self-centering function on the susceptor 28.

Figure 6:
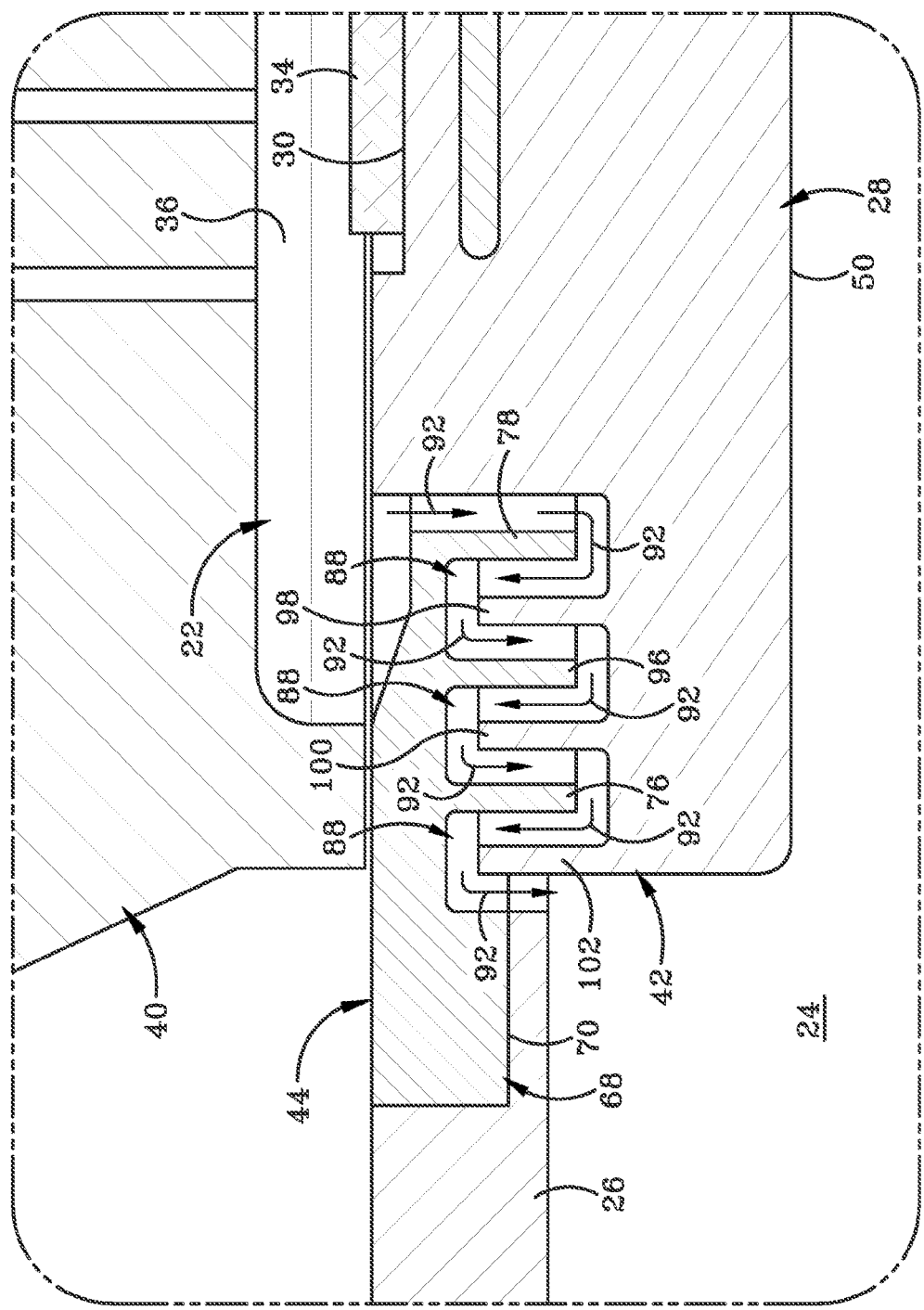
FIG. 6 schematically shows a sectional view of the area labeled FIG. 5 in FIG. 2 with a second implementation sealing member.

Referring now to FIG. 6, another aspect of the first sealing member 42 and the second sealing member 44 are shown in section with the first sealing member 42 formed integral with susceptor 28. Specifically, a middle protrusion 96 is included in second sealing member 44 in addition to protrusions 98, 100, and 102 extending upward from susceptor 28. In this arrangement, ledge 48 of the first aspect has been replaced with three protrusions 98, 100, and 102 which are nested within channels 88 formed between each of the various protrusions extending downward from the second sealing member 44. In this arrangement, gas path 92 requires following a tortuous path through a plurality of channels 88 having protrusions 98, 100, and 102 therein to further restrict the gas flow path. Accordingly, even less gas flow communication is obtained between upper region 22 and lower region 24 when additional protrusions are included in the tortuous path. Thus it is seen that any number of protrusions may be utilized in the first and second sealing members depending on the restrictions of gas flow required by the tool or process. Further, the distances between the protrusions and open spaces there between may be optimized as may be necessary. Finally, the protrusions in the first sealing member 42 may be formed as part of a separate removable piece or may be formed integral with the susceptor, while the protrusions of the second sealing member 44 may be formed as a separate removable piece or may be formed integral to the reaction chamber 20 or an interface plate as may be appropriate.

Referring now to FIGS. 7-15, another aspect chamber sealing device is shown, although the remaining components are the same and/or similar. A first sealing member 104 is removably positionable on ledge 48 of susceptor 28, while a second sealing member 106 is generally positioned within lower region 24 and removably attached to interface plate 26. Specifically, second sealing member 106 may be removably secured to the interface plate 26 with a mounting plate 108 and a plurality of bolts 110. The second sealing member 106 may be secured with the mounting plate at an outer perimeter 112 of a spring sealing member 114 in either lower region 24 or upper region 22. The spring sealing member 114 may also include an inner perimeter 116 which may be deflected by first sealing member 104 when the susceptor 28 is moved in the direction associated with arrows 38 until a processing position is reached.

Figure 9:
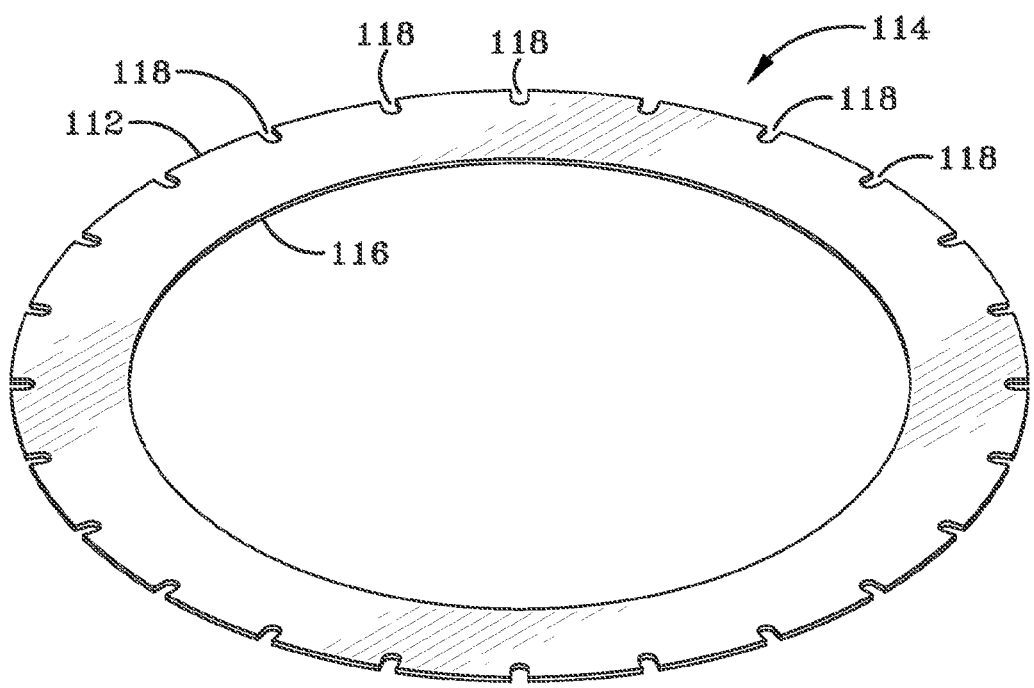
FIG. 9 schematically shows a perspective view of a third implementation second sealing member.
Figure 11:
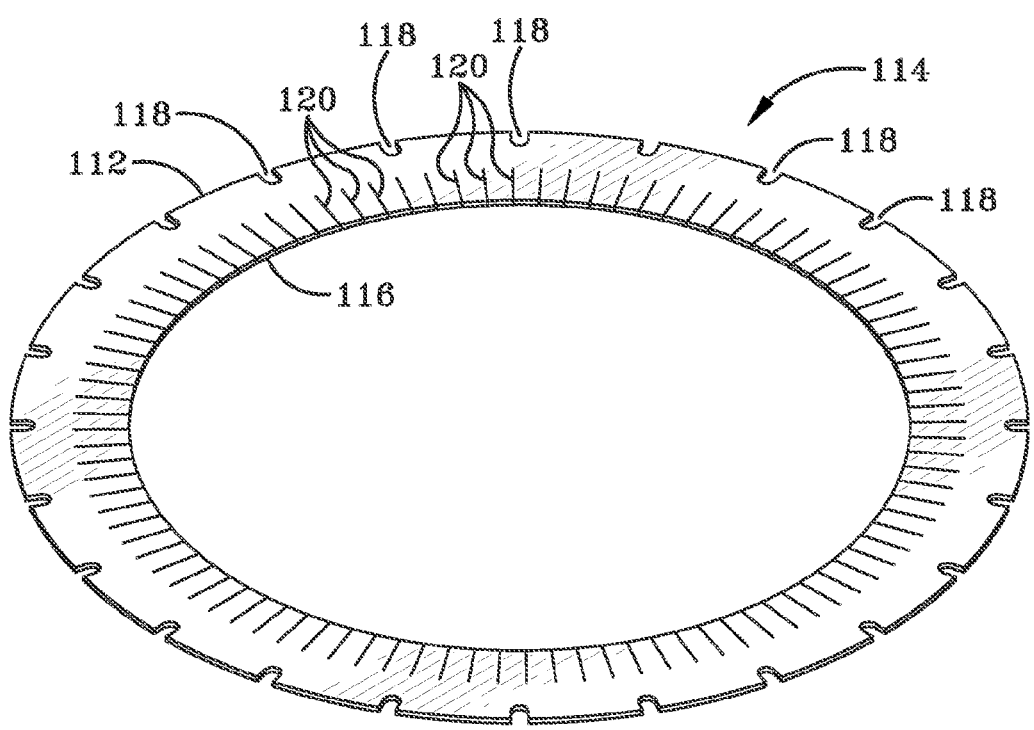
FIG. 11 schematically shows a perspective view of fourth implementation second sealing member.

Referring to FIGS. 9 and 11, spring sealing members 114 are shown with notches 118 on the outer perimeter 112 of the spring sealing member. In one implementation, 24 notches are included and a bolt is used to secure the spring sealing member to the mounting plate 108 at each of the notches and between the interface plate 26 and the mounting plate 108. As also seen in FIG. 11, a plurality of slits 120 may be included around the inner perimeter 116 of the spring sealing member 114 to provide a minimal and controlled transfer rate between the upper and lower regions of the reaction chamber. In one implementation, the slits 120 may be radially aligned along the inner perimeter 116 and may include approximately 100 slits, or any other suitable number. It will be appreciated by a person of skill in the art that any suitable number of notches or slits may be utilized so long as the spring sealing member is properly secured and the gas flow rate between the upper region and the lower region is controlled.

Figure 7:
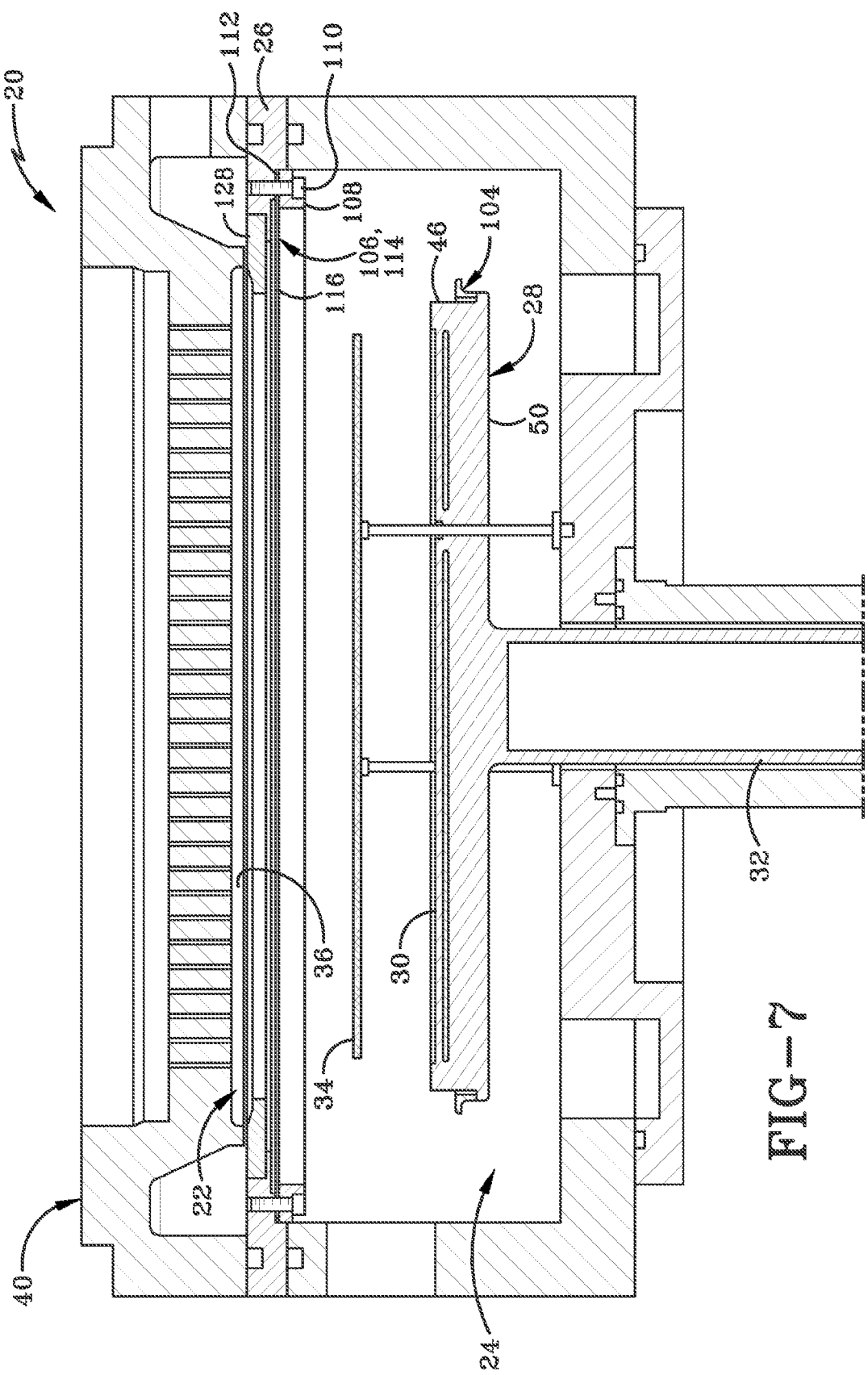
FIG. 7 schematically shows a substrate processing chamber including a first sealing member and a second sealing member in a substrate loading position.
Figure 8:
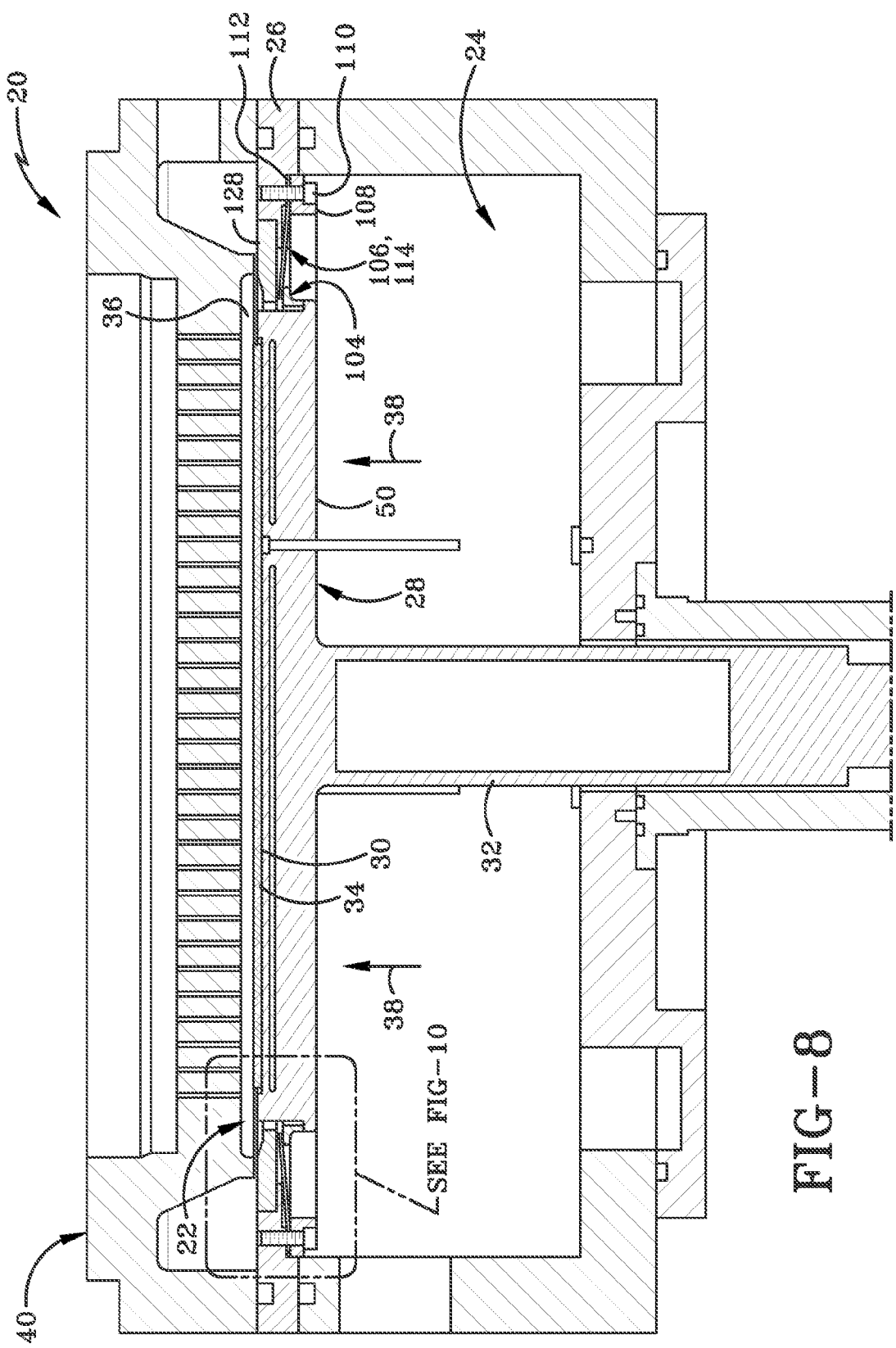
FIG. 8 schematically shows a substrate processing chamber with a susceptor, a first sealing member, and a second sealing member in a processing position.
Figure 10:
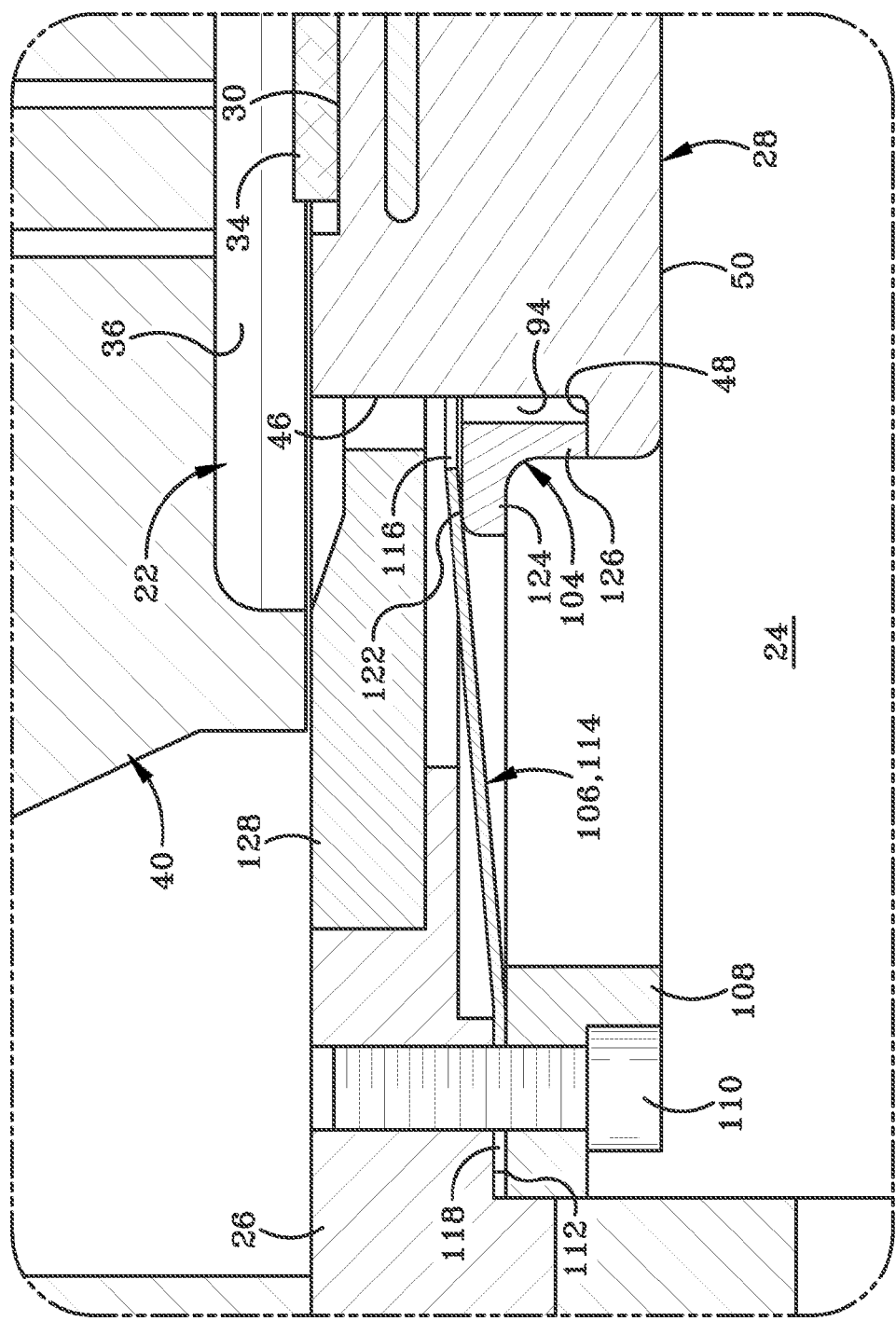
FIG. 10 schematically shows a sectional view of the area labeled FIG. 10 in FIG. 8.

FIGS. 7, 8 and 10 illustrate views of spring sealing member 114 in an unbiased position (FIG. 7) and a biased or deflected position (FIGS. 8 and 10). In the biased or deflected views, spring sealing member 114 is resiliently bent upwards by a top surface 122 of the first sealing member 104. Specifically, top surface 122 is positioned on a flat portion of shelf 124 separated from ledge 48 by spacing portion 126. In this arrangement, spring sealing member 114 is bent upwards by contact at top surface 122 and thereby limits communication between the upper region and the lower region. The area between a flow control ring 128, spring sealing member 114, susceptor 28, and gap 94 may collect some portion of a processing or purge gas, but this may ultimately be dissipated by vacuum measures, purging, or the disconnection between the first and second sealing members when the substrate is unloaded.

Figure 12:
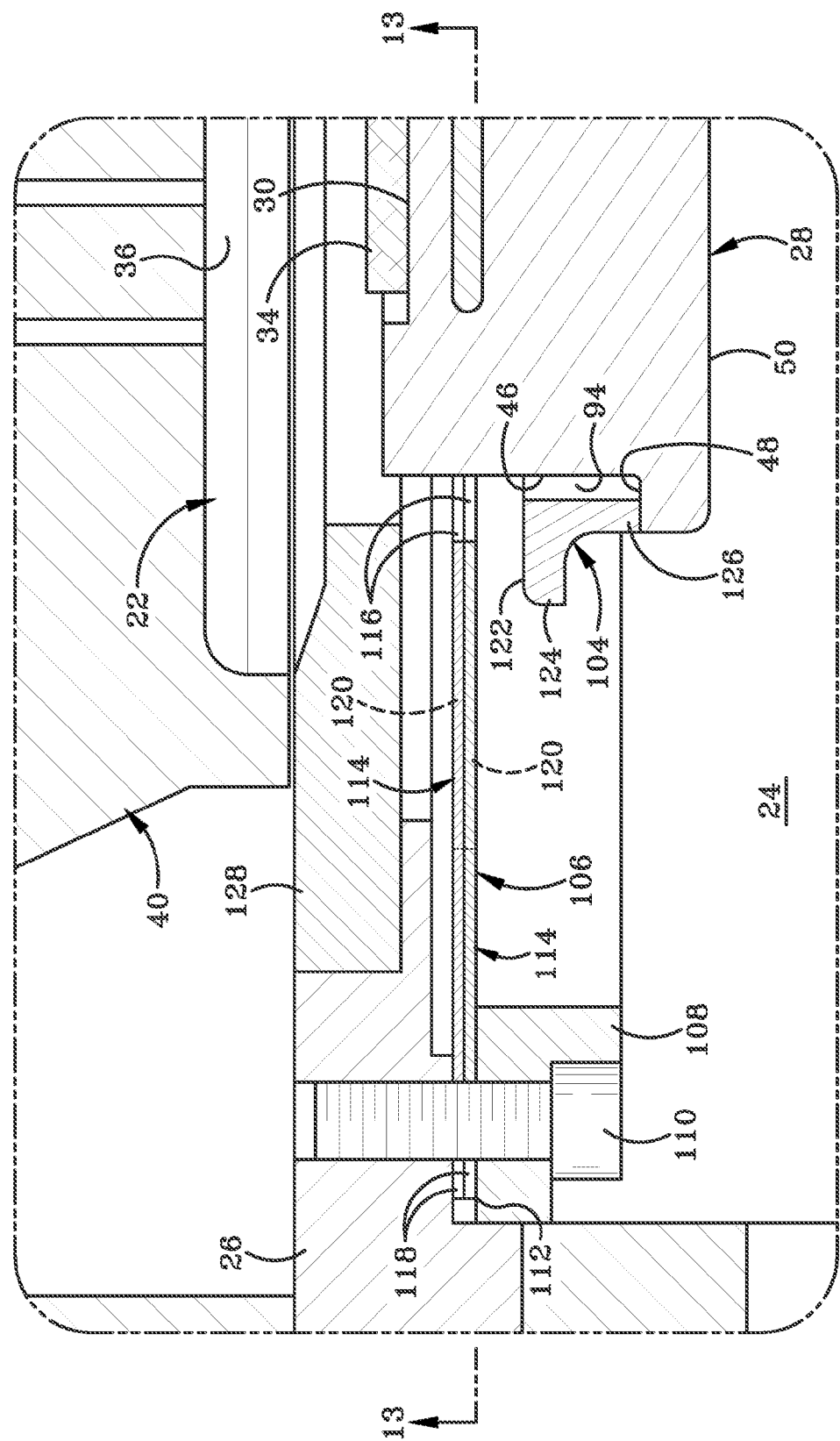
FIG. 12 schematically shows a sectional view of the area labeled FIG. 10 in FIG. 8 with a fourth implementation second sealing member with the first and second sealing members disengaged.
Figure 15:
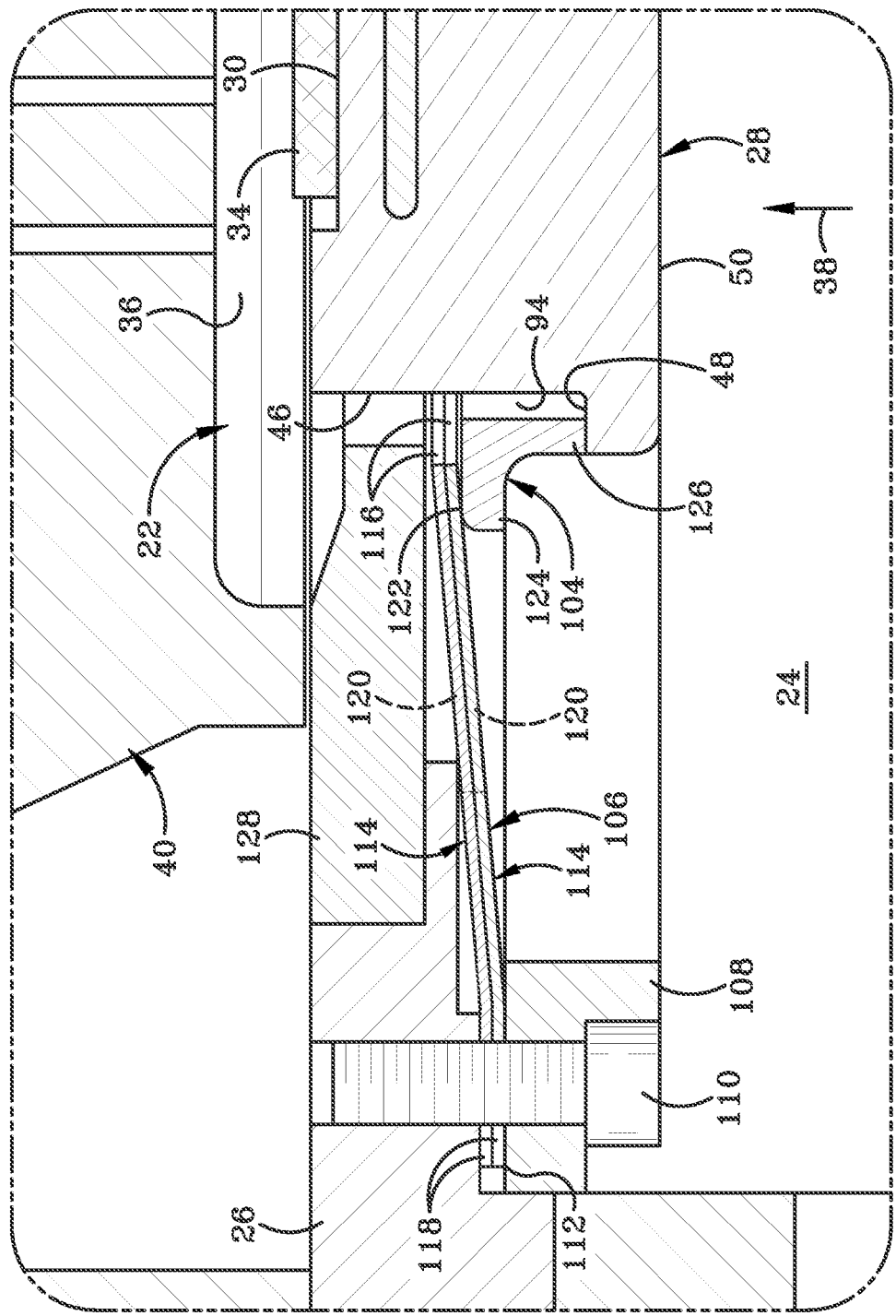
FIG. 15 schematically shows a sectional view of the area labeled FIG. 10 in FIG. 8 with a fourth implementation second sealing member with the first and second sealing members engaged.

Referring now to FIGS. 11-15, two spring sealing members 114 are positioned one on top of the other as particularly shown in FIG. 12. Specifically, two spring sealing members 114 are positioned between mounting plate 108 and interface plate 26, with bolts 110 maintaining the relationship between the components. FIGS. 13 and 14 illustrate the arrangement of the two spring sealing members 114 with slits 120 in each sealing member being aligned offset from one another such that slits 120 on an upper spring sealing member are positioned between slits 120 in the lower spring sealing member. In this arrangement, gas flow in the under region is prevented from flowing into the lower region when susceptor 28 is in a processing position as discussed with respect to FIGS. 7-10, with the exception of slits 120. For example, the orientation of two spring sealing members 114 as seen in FIG. 14 may permit gas flow from the upper region through the upper spring sealing member at slits 120 and then through slits 120 in the lower spring sealing member. In this arrangement, a tortuous path is again formed whereby a limited and controlled amount of gas flow may communicate between the upper region and the lower region as the process may require. The dual spring sealing member arrangement functions similar to a single spring sealing member as discussed above and only limits and/or prevents gas flow between the upper and lower regions when susceptor 28 and first sealing member 104 are moved upwards in the direction associated with arrow 38 and the susceptor is in a processing position. A person of ordinary skill in the art will immediately appreciate that any number of slits 120 may be utilized depending on the desired communication between the upper and lower regions without departing from the spirit and scope of the present disclosure.

Throughout the description, any gas flow communication has been passing from the upper region 22 to the lower region 24 in a controlled and/or limited fashion. Nevertheless, it is within the spirit and scope of this disclosure to provide gas flow from the lower region to the upper region. For example, a purge, an inert, or other gas flow within the lower region may be provided at a pressure which is greater than the gas flow pressure in the upper region. In this instance, the higher pressure in the lower region would then permit gas flow from the lower region to communicate into the upper region through the various tortuous paths described and defined above. This arrangement may be useful to decrease purge times by limiting resonance within pockets and gaps in the upper region or reduce particle build-up in the lower region. Regardless, the various sealing members gas flow communication may be selectively tuned to control the amount and direction of the gas flow between the upper and lower regions.

In operation, the first sealing member 42 or 104 is positioned on susceptor 28 and may particularly be positioned on a ledge 48 if applicable. The second sealing member 44 or 106 is then positioned generally between the upper and lower regions, or in contact with an interface plate 26, either above in the case of second sealing member 44 or below in the case of second sealing member 106. With the first and second sealing members in position, the susceptor 28 is lowered to the substrate loading position where a substrate is positioned on lift pins. Next, the susceptor is moved upwards in the direction associated with arrows 38 until the first sealing member forms a tortuous path with the second sealing member. In some implementations, the first and second sealing members contact one another when the susceptor is in a processing position, while in other implementations a small gap remains between the first and second sealing members, but is generally incorporated into the tortuous path. Regardless of which aspect or implementation is utilized, gas flow between the upper and lower regions is controlled and/or minimized when the susceptor is in a processing position. After the process is completed, the susceptor is lowered into the lower region and regular communication between the upper and lower regions may again be established until another substrate is loaded on the susceptor and the susceptor is moved into the processing position once again.

These and other embodiments for methods and apparatus for a chamber sealing member may incorporate concepts, embodiments, and configurations as described with respect to embodiments of apparatus for chamber sealing members described above. The particular implementations shown and described are illustrative of the invention and its best mode and are not intended to otherwise limit the scope of the aspects and implementations in any way. Indeed, for the sake of brevity, conventional manufacturing, connection, preparation, and other functional aspects of the system may not be described in detail. Furthermore, the connecting lines shown in the various figures are intended to represent exemplary functional relationships and/or physical couplings between the various elements. Many alternative or additional functional relationship or physical connections may be present in the practical system, and/or may be absent in some embodiments.

As used herein, the terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present invention, in addition to those not specifically recited, may be varied or otherwise particularly adapted to specific environments, manufacturing specifications, design parameters or other operating requirements without departing from the general principles of the same.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and subcombinations of the various processes, systems and configurations, and other features, functions, acts, and/or properties disclosed herein, as well as any and all equivalents thereof.

We claim:

1. A reaction chamber comprising:
   an upper region for processing a substrate;
   a lower region for loading a substrate;
   an interface plate between the upper region and the lower region;
   a susceptor movable within the reaction chamber;
   a first sealing member positioned on a perimeter of the susceptor when the susceptor is in the lower region; and
   a second sealing member having a bottom portion engaged with a top portion of the interface plate and positioned between the upper region and the lower region;
   wherein the first and second sealing members are selectively engaged with one another to limit communication between the upper region and the lower region.

2. The reaction chamber of claim 1 wherein the first sealing member is removably positioned on the susceptor.

3. The reaction chamber of claim 1 wherein the second sealing member is removably positioned between the upper region and the lower region.

4. The reaction chamber of claim 1 further comprising a gap between a perimeter of the susceptor and the first sealing member.

5. The reaction chamber of claim 4 wherein the gap decreases when the reaction chamber is at a processing temperature.

6. The reaction chamber of claim 1 wherein the first sealing member travels vertically with the susceptor.

7. The reaction chamber of claim 1 further comprising a showerhead in the upper region, wherein the second sealing member is secured between the showerhead and the first sealing member.

8. The reaction chamber of claim 1 wherein a processing gas travels between the first sealing member and the second sealing member when the susceptor is in a processing position.

9. The reaction chamber of claim 1 wherein one or more of the first sealing member and the second sealing member comprise quartz.

10. The reaction chamber of claim 1 wherein the first sealing member is self-centering on the susceptor.

11. The reaction chamber of claim 1 wherein the first sealing member further comprises at least one protrusion extending upward.

12. The reaction chamber of claim 11 wherein the second sealing member further comprises at least one protrusion extending downward.

13. The reaction chamber of claim 12 wherein the first sealing member at least one protrusion and the second sealing member at least one protrusion are nested together when the susceptor is in a processing position.

14. The reaction chamber of claim 13 wherein a tortuous path is defined between the first sealing member and the second sealing member.

15. The reaction chamber of claim 1 wherein one or both of the first sealing member and the second sealing member comprise three protrusions.

16. The reaction chamber of claim 1 wherein the second sealing member is flexible and the first sealing member deflects the second sealing member when the susceptor is in a processing position.

17. The reaction chamber of claim 16 wherein the second sealing member is secured to the reaction chamber within the lower region.

18. A reaction chamber isolation device comprising:
a first sealing member movable within a reaction chamber and removably positionable on a susceptor, the first sealing member comprising an upper portion and a lower portion, the lower portion located inward of the upper portion; and
a second sealing member positionable on an interface plate within the reaction chamber between an upper region and a lower region;
wherein the first and second sealing members are selectively engageable with one another to limit communication between the upper region and the lower region.

19. The reaction chamber isolation device of claim 18 wherein the first sealing member further comprises at least one protrusion extending upward and the second sealing member further comprises at least one protrusion extending downward.

20. The reaction chamber isolation device of claim 19 wherein the first sealing member at least one protrusion and the second sealing member at least one protrusion are nested together when the susceptor is in a processing position.

21. The reaction chamber isolation device of claim 18 wherein a tortuous path is defined between the first sealing member and the second sealing member.

22. The reaction chamber isolation device of claim 18 wherein the second sealing member is flexible and the first sealing member deflects the second sealing member when the susceptor is in a processing position.

23. A reaction chamber isolation device comprising:
a first sealing member movable within a reaction chamber and removably positionable on a susceptor; and
a second sealing member positionable on an interface plate within the reaction chamber between an upper region and a lower region,
wherein the first and second sealing members are selectively engageable with one another to form a tortuous path including a gap between an inner surface of the first sealing member and an outer surface of the susceptor.

* * * * *